(12) United States Patent
Shiraishi et al.

(10) Patent No.: US 12,014,947 B2
(45) Date of Patent: *Jun. 18, 2024

(54) ELECTROSTATIC CHUCK

(71) Applicant: TOTO LTD., Kitakyushu (JP)

(72) Inventors: Jun Shiraishi, Kitakyushu (JP);
Shuichiro Saigan, Kitakyushu (JP);
Tatsuya Mori, Kitakyushu (JP);
Masahiro Watanabe, Kitakyushu (JP)

(73) Assignee: Toto, Ltd., Fukuoka (JP)

( * ) Notice: Subject to any disclaimer, the term of this patent is extended or adjusted under 35 U.S.C. 154(b) by 213 days.

This patent is subject to a terminal disclaimer.

(21) Appl. No.: 17/690,337

(22) Filed: Mar. 9, 2022

(65) Prior Publication Data

US 2022/0199452 A1    Jun. 23, 2022

Related U.S. Application Data

(63) Continuation of application No. 16/576,220, filed on Sep. 19, 2019, now Pat. No. 11,309,204.

(30) Foreign Application Priority Data

Oct. 30, 2018 (JP) .................................. 2018-203749
Sep. 12, 2019 (JP) .................................. 2019-166033

(51) Int. Cl.
*H01L 21/683* (2006.01)

(52) U.S. Cl.
CPC .............................. *H01L 21/6833* (2013.01)

(58) Field of Classification Search
CPC ........... H01L 21/67109; H01L 21/6833; H01L 21/68785; H01L 21/68757; H01L 21/6831; H01L 21/6838

USPC ......................................................... 361/234
See application file for complete search history.

(56) References Cited

U.S. PATENT DOCUMENTS

| | | | |
|---|---|---|---|
| 9,165,813 B2 * | 10/2015 | Kataigi | ............... H01L 21/6833 |
| 2005/0011456 A1 | 1/2005 | Himori et al. | |
| 2005/0105243 A1 | 5/2005 | Lee et al. | |
| 2009/0086401 A1 | 4/2009 | Samir et al. | |
| 2009/0230636 A1 | 9/2009 | Goto | |

(Continued)

FOREIGN PATENT DOCUMENTS

| | | |
|---|---|---|
| CN | 101409251 A | 4/2009 |
| JP | 2005-347400 A | 12/2005 |

(Continued)

*Primary Examiner* — Kevin J Comber
(74) *Attorney, Agent, or Firm* — Carrier, Shende & Associates P.C.; Fulchand P. Shende; Joseph P. Carrier

(57) ABSTRACT

An electrostatic chuck includes a ceramic dielectric substrate, a base plate, and a first porous part. The ceramic dielectric substrate has a first major surface and a second major surface. The base plate supports the ceramic dielectric substrate and includes a gas feed channel. The first porous part is provided between the base plate and the first major surface. The ceramic dielectric substrate includes a first hole part. The first porous part includes a porous section, and a first compact section being more compact than the porous section. The porous section including a plurality of sparse portions including a plurality of pores including a first pore and a second pore, and a dense portion having a higher density than the sparse portion.

3 Claims, 18 Drawing Sheets

(56) References Cited

U.S. PATENT DOCUMENTS

2010/0122774 A1* 5/2010 Makabe ............ H01L 21/67109
  156/345.52
2016/0276198 A1* 9/2016 Anada ................ H01L 21/6831
2017/0358476 A1* 12/2017 Horiuchi ................ C04B 41/91

FOREIGN PATENT DOCUMENTS

| JP | 2009-158917 A | 7/2009 |
| JP | 2010-123712 A | 6/2010 |
| TW | I518841 B | 1/2016 |

* cited by examiner

ELECTROSTATIC CHUCK

CROSS-REFERENCE TO RELATED APPLICATIONS

This application is a continuation of U.S. patent application Ser. No. 16/576,220, filed Sep. 19, 2019, which is based upon and claims the benefit of priority from Japanese Patent Application No. 2018-203749, filed on Oct. 30, 2018 and Japanese Patent Application No. 2019-166033, filed on Sep. 12, 2019. The entire contents of each of these priority applications are incorporated herein by reference.

FIELD

Embodiments described herein relate generally to an electrostatic chuck.

BACKGROUND

A ceramic electrostatic chuck is fabricated by sandwiching an electrode between ceramic dielectric substrates made of e.g. alumina, followed by firing. Electric power for electrostatic suction is applied to the incorporated electrode. Thus, the electrostatic chuck sucks a substrate such as a silicon wafer by electrostatic force. In such an electrostatic chuck, an inert gas such as helium (He) is passed between the front surface of the ceramic dielectric substrate and the back surface of the suction target substrate to control the temperature of the suction target substrate.

For instance, the temperature increase of the substrate may be associated with processing in a device for processing a substrate such as a CVD (chemical vapor deposition) device, sputtering device, ion implantation device, and etching device. In the electrostatic chuck used in such devices, an inert gas such as He is passed between the ceramic dielectric substrate and the suction target substrate to bring the substrate into contact with the inert gas. Thus, the temperature increase of the substrate is suppressed.

In the electrostatic chuck for controlling the substrate temperature with an inert gas such as He, a hole (gas feed channel) for feeding an inert gas such as He is provided in the ceramic dielectric substrate and a base plate for supporting the ceramic dielectric substrate. The ceramic dielectric substrate is provided with a through hole communicating with the gas feed channel of the base plate. Thus, the inert gas fed from the gas feed channel of the base plate is guided through the through hole of the ceramic dielectric substrate to the back surface of the substrate.

Here, when the substrate is processed in the device, electric discharge (arc discharge) may occur from the plasma in the device toward the metallic base plate. The gas feed channel of the base plate and the through hole of the ceramic dielectric substrate may be likely to constitute a path of discharge. Thus, there is known a technique in which a porous part is provided in the gas feed channel of the base plate and the gas feed channel of the ceramic dielectric substrate to improve resistance (such as breakdown voltage) to arc discharge.

For instance, Japanese Unexamined Patent Publication No. 2010-123712 discloses an electrostatic chuck that suppresses the occurrence of arc discharge in the gas flow channel. In this electrostatic chuck, an insulative ceramic sintered porous body is provided inside the metallic base material. The ceramic sintered porous body is provided with a through hole for feeding an inert gas. However, in such a configuration, the through hole provided in the ceramic sintered porous body may constitute a path of discharge.

Japanese Unexamined Patent Publication No. 2005-347400 discloses that a gas dispersion layer composed of dielectric particles is provided inside the depression of the insulator. However, in such a configuration, the gap between the dielectric particles may constitute a path of discharge.

Thus, regarding an electrostatic chuck provided with a porous part, it has been desired to develop an electrostatic chuck capable of further suppressing the occurrence of arc discharge.

SUMMARY

An embodiment of the invention provides an electrostatic chuck comprising a ceramic dielectric substrate, a base plate, and a first porous part. The ceramic dielectric substrate has a first major surface for mounting a suction target and a second major surface on opposite side from the first major surface. The base plate supports the ceramic dielectric substrate and includes a gas feed channel. The first porous part is provided at a position between the base plate and the first major surface of the ceramic dielectric substrate. The position is opposed to the gas feed channel. The ceramic dielectric substrate includes a first hole part located between the first major surface and the first porous part. The first porous part includes a porous section including a plurality of pores, and a first compact section being more compact than the porous section. As projected on a plane perpendicular to a first direction from the base plate to the ceramic dielectric substrate, the first compact section is configured to overlap the first hole part, and the porous section is configured not to overlap the first hole part.

DETAILED DESCRIPTION

Figure 1:
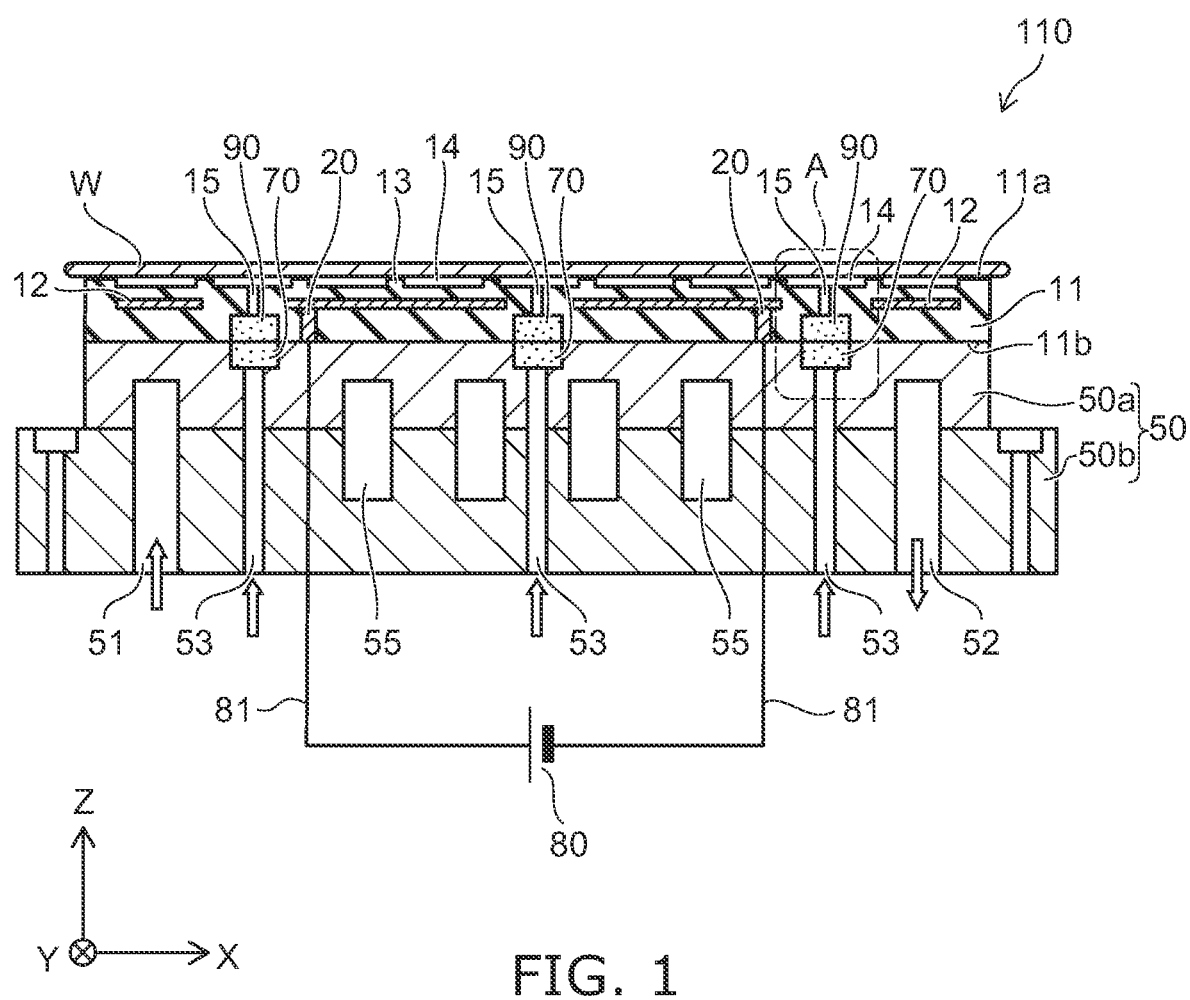
FIG. 1 is a schematic sectional view illustrating an electrostatic chuck according to a first embodiment.

A first aspect of the invention is an electrostatic chuck comprising a ceramic dielectric substrate, a base plate, and a first porous part. The ceramic dielectric substrate has a first major surface for mounting a suction target and a second major surface on opposite side from the first major surface. The base plate supports the ceramic dielectric substrate and includes a gas feed channel. The first porous part is provided at a position between the base plate and the first major surface of the ceramic dielectric substrate. The position is opposed to the gas feed channel. The ceramic dielectric substrate includes a first hole part located between the first major surface and the first porous part. The first porous part includes a porous section including a plurality of pores, and a first compact section being more compact than the porous section. As projected on a plane perpendicular to a first direction from the base plate to the ceramic dielectric substrate, the first compact section is configured to overlap the first hole part, and the porous section is configured not to overlap the first hole part.

In this electrostatic chuck, the first compact section and the first hole part are configured to overlap each other. Thus, the generated current is caused to flow around the first compact section. Accordingly, the current can be caused to flow a longer distance (conduction path). This can suppress acceleration of electrons, and can suppress the occurrence of arc discharge. In this electrostatic chuck, the occurrence of arc discharge can be effectively suppressed while ensuring the gas flow.

A second aspect of the invention is the electrostatic chuck according to the first aspect of the invention, wherein as projected on the plane perpendicular to the first direction from the base plate to the ceramic dielectric substrate, the porous section is provided around the first compact section.

In this electrostatic chuck, reduction of arc discharge can be made compatible with smoothing of the flow of gas.

A third aspect of the invention is the electrostatic chuck according to the first or second aspect of the invention, wherein length along the first direction of the first compact section is smaller than length along the first direction of the first porous part.

This electrostatic chuck can smooth the gas flow while suppressing the occurrence of arc discharge.

A fourth aspect of the invention is the electrostatic chuck according to one of the first to third aspects of the invention, wherein in the first direction, the porous section is provided between the first compact section and the base plate.

This electrostatic chuck can reduce arc discharge and smooth the flow of gas.

A fifth aspect of the invention is the electrostatic chuck according to one of the first to fourth aspects of the invention, wherein length along the first direction of the first compact section is generally equal to length along the first direction of the first porous part.

In this electrostatic chuck, the length along the first direction of the first compact section is made generally equal to the length along the first direction of the first porous part. This can suppress the occurrence of arc discharge more effectively.

A sixth aspect of the invention is the electrostatic chuck according to one of the first to seventh aspects of the invention, further comprising a second porous part provided between the first porous part and the gas feed channel and including a plurality of pores. Average value of diameter of the plurality of pores provided in the second porous part is larger than average value of diameter of the plurality of pores provided in the first porous part.

This electrostatic chuck is provided with a second porous part having a large pore diameter. This can smooth the flow of gas. The first porous part having a small pore diameter is provided on the suction target side. This can suppress the occurrence of arc discharge more effectively.

A seventh aspect of the invention is the electrostatic chuck according to one of the first to seventh aspects of the invention, further comprising a second porous part provided between the first porous part and the gas feed channel and including a plurality of pores. Average value of diameter of the plurality of pores provided in the second porous part is larger than average value of diameter of the plurality of pores provided in the porous section.

This electrostatic chuck is provided with a second porous part having a small pore diameter. This can suppress the occurrence of arc discharge more effectively.

An eighth aspect of the invention is the electrostatic chuck according to one of the first to eighth aspects of the invention, further comprising a second porous part provided between the first porous part and the gas feed channel and including a plurality of pores. Variation in diameter of the plurality of pores provided in the first porous part is smaller than variation in diameter of the plurality of pores provided in the second porous part.

In this electrostatic chuck, variation in the diameter of the plurality of pores provided in the first porous part is smaller than variation in the diameter of the plurality of pores provided in the second porous part. This can suppress the occurrence of arc discharge more effectively.

A ninth aspect of the invention is the electrostatic chuck according to one of the fifth to eighth aspects of the invention, wherein a plurality of pores provided in the second porous part are further dispersed in three dimensions than a plurality of pores provided in the first porous part. Proportion of pores penetrating in the first direction is higher in the first porous part than in the second porous part.

The example of three-dimensional dispersion of pores will be described later with reference to FIG. 10.

In this electrostatic chuck, a higher breakdown voltage can be obtained by providing a second porous part including a plurality of pores dispersed in three dimensions. This can suppress the occurrence of arc discharge more effectively. The flow of gas can be smoothed by providing a first porous part having a high proportion of pores penetrating in the first direction.

A tenth aspect of the invention is the electrostatic chuck according to one of the first to ninth aspects of the invention, wherein the first porous part and the ceramic dielectric substrate are composed primarily of aluminum oxide. Purity of the aluminum oxide of the ceramic dielectric substrate is higher than purity of the aluminum oxide of the first porous part.

This electrostatic chuck can ensure its performance such as plasma resistance, and ensure the mechanical strength of the first porous part. As an example, a trace amount of additive is contained in the first porous part. This facilitates sintering the first porous part, and can control the pores and ensure the mechanical strength.

An eleventh aspect of the invention is the electrostatic chuck according to one of the first to tenth aspects of the invention, wherein the porous section includes a plurality of sparse portions including a plurality of pores including the first pore and the second pore, and a dense portion having a higher density than the sparse portion. Each of the plurality of sparse portions extends in the first direction. The dense portion is located between the plurality of sparse portions. The sparse portion includes a wall part provided between the first pore and the second pore. In the second direction, minimum dimension of the wall part is smaller than minimum dimension of the dense portion.

In this electrostatic chuck, the first porous part is provided with the sparse portions and the dense portion extending in the first direction. This can improve the mechanical strength (rigidity) of the first porous part while ensuring arc discharge resistance and gas flow rate.

A twelfth aspect of the invention is the electrostatic chuck according to the eleventh aspect of the invention, wherein in the second direction, dimension of the plurality of pores provided in each of the plurality of sparse portions is smaller than dimension of the dense portion.

In this electrostatic chuck, the dimension of the plurality of pores can be made sufficiently small. This can further improve resistance to arc discharge.

A thirteenth aspect of the invention is the electrostatic chuck according to the eleventh or twelfth aspect of the invention, wherein aspect ratio of the plurality of pores provided in each of the plurality of sparse portions is 30 or more and 10000 or less.

This electrostatic chuck can further improve resistance to arc discharge.

A fourteenth aspect of the invention is the electrostatic chuck according to one of the eleventh to thirteenth aspects of the invention, wherein in the second direction, dimension of the plurality of pores provided in each of the plurality of sparse portions is 1 micrometer or more and 20 micrometers or less.

In this electrostatic chuck, pores having a pore dimension of 1-20 micrometers and extending in one direction can be arranged. This can achieve high resistance to arc discharge.

A fifteenth aspect of the invention is the electrostatic chuck according to one of the eleventh to fourteenth aspects of the invention, wherein as viewed along the first direction, the first pore is located in a central part of the sparse portion. Among the plurality of pores, number of pores neighboring the first pore and surrounding the first pore is 6.

In this electrostatic chuck, in plan view, a plurality of pores can be arranged with high isotropy and high density. This can improve the rigidity of the first porous part while ensuring arc discharge resistance and gas flow rate.

An sixteenth aspect of the invention is the electrostatic chuck according to one of the first to fifteenth aspects of the invention, wherein the first compact section includes a plurality of pores. Diameter of the pore included in the first compact section is smaller than diameter of the pore included in the porous section.

In this electrostatic chuck, the diameter of the pore of the first compact section provided at the position opposed to the first hole part is relatively small. This can further enhance arc discharge resistance. The diameter of the pore of the porous section is relatively large. This can ensure sufficient gas flow.

A seventeenth aspect of the invention is the electrostatic chuck according to the sixteenth aspect of the invention, wherein when the first compact section includes the plurality of pores, porosity of the first compact section is 50% or less of porosity of the porous section, or diameter of the pore included in the first compact section is 80% or less of diameter of the pore included in the porous section.

This electrostatic chuck can ensure resistance to arc discharge and the flow rate of the flowing gas.

An eighteenth aspect of the invention is the electrostatic chuck according to one of the first to seventeenth aspects of the invention, wherein at least one of the ceramic dielectric substrate and the porous section includes a second hole part located between the first hole part and first porous part. In a second direction generally orthogonal to the first direction from the base plate to the ceramic dielectric substrate, dimension of the second hole part is smaller than dimension of the first porous part and larger than dimension of the first hole part.

This electrostatic chuck is provided with a second hole part smaller than the dimension of the first porous part and larger than the dimension of the first hole part. Thus, sufficient gas flow can be ensured even when the porous section is provided at a position not overlapping the first hole part as projected on the plane perpendicular to the first direction. This enables effective compatibility with resistance to arc discharge.

A nineteenth aspect of the invention is the electrostatic chuck comprising a ceramic dielectric substrate having a first major surface for mounting a suction target and a second major surface on opposite side from the first major surface, a base plate supporting the ceramic dielectric substrate and including a gas feed channel, a first porous part provided at a position between the base plate and the first major surface of the ceramic dielectric substrate, the position being opposed to the gas feed channel, and a second porous part provided between the first porous part and the gas feed channel. The ceramic dielectric substrate includes a first hole part located between the first major surface and the first porous part. The second porous part includes a second porous section including a plurality of pores, and a third compact section more compact than the porous section. As projected on a plane perpendicular to a first direction from the base plate to the ceramic dielectric substrate, the third compact section is configured to overlap the first hole part, and the second porous section is configured not to overlap the first hole part.

In this electrostatic chuck, the third compact section and the first hole part are configured to overlap each other. Thus, the generated current is caused to flow around the third compact section. Accordingly, the current can be caused to flow a longer distance (conduction path). This can suppress acceleration of electrons, and can suppress the occurrence of arc discharge. In this electrostatic chuck, the occurrence of arc discharge can be effectively suppressed while ensuring the gas flow.

A twentieth aspect of the invention is the electrostatic chuck according to nineteenth aspects of the invention, wherein the first porous part includes a porous section including a plurality of pores, the porous section includes a plurality of first sparse portions including a first pore and a second pore and a dense portion having a density higher than a density of the first sparse portions, each of the plurality of first sparse portions extends in the first direction, the dense portion is located between the plurality of first sparse portions, the first sparse portion includes a wall part provided between the first pore and the second pore, and in the second direction, minimum dimension of the wall part is smaller than minimum dimension of the dense portion.

In this electrostatic chuck, the first porous section has the configuration described above. This can suppress the occurrence of arc discharge more effectively.

A twenty first aspect of the invention is the electrostatic chuck according to nineteenth or twenty first aspects of the invention, wherein the second porous section includes a plurality of second sparse portions including a plurality of pores including a third pore and a fourth pore, and a second dense portion having a density higher than a density of the second sparse portions, each of the plurality of second sparse portions extends in the first direction, the second dense portion is located between the plurality of second sparse portions, the second sparse portions includes a second wall part provided between the third pore and the fourth pore, and in the second direction, minimum dimension of the second wall part is smaller than minimum dimension of the second dense portion.

In this electrostatic chuck, the second porous section has the configuration described above. This can suppress the occurrence of arc discharge more effectively.

A twenty second aspect of the invention is the electrostatic chuck according to one of first to twenty first aspects of the invention, wherein when a direction generally orthogonal to the first direction is taken as a second direction, the first porous part includes a first region located on the ceramic dielectric substrate side in the second direction, the ceramic dielectric substrate includes a first substrate region located the first region side in the second direction, the first region is provided to be in contact with the first substrate region, and an average grain size in the first region is different from an average grain size in the first substrate region.

In this electrostatic chuck, an average grain size in the first region is different from an average grain size in the first substrate region. This can improve the coupling strength between the first porous part and the ceramic dielectric substrate at an interface between the first porous part and the ceramic dielectric substrate.

A twenty third aspect of the invention is the electrostatic chuck according to the twenty first or twenty second aspect of the invention, wherein the average grain size in the first substrate region is smaller than the average grain size in the first region.

In this electrostatic chuck, the coupling strength between the first porous part and the ceramic dielectric substrate can be improved at the interface between the first porous part and the ceramic dielectric substrate. The grain size in the first substrate region is small, and thus the strength of the ceramic dielectric substrate cab be increased and risk such as crack or the like due to a stress generated in manufacturing or processing can be suppressed.

A twenty fourth aspect of the invention is the electrostatic chuck according to one of the twenty first or twenty third aspects of the invention, wherein the ceramic dielectric substrate includes a second substrate region, the first substrate region is located between the second substrate region and the first porous part, and the average grain size in the first substrate region is smaller than the average grain size in the second substrate region.

In the first substrate region provided to be in contact with the first region, it is desirable to increase the interface strength between the first substrate region and the first region by interaction such as diffusion or the like between the first substrate region and the first region at sintering in the manufacturing process, for instance. On the other hand, in the second substrate region, it is desirable that intrinsic characteristics of the material of the ceramic dielectric substrate are expressed. In this electrostatic chuck, the average grain size in the first substrate region is made smaller than the average grain size in the second substrate region. The security of the interface strength in the first substrate region and the characteristics of the ceramic dielectric substrate in the second substrate region can be compatible.

A twenty fifth aspect of the invention is the electrostatic chuck of the twenty fourth aspect of the invention, wherein the average grain size in the first region is smaller than the average grain size in the second substrate region.

In this electrostatic chuck, the average grain size in the first region is smaller than the average grain size in the second substrate region. This can improve the mechanical strength in the first region.

A twenty sixth aspect of the invention is the electrostatic chuck according to one of the twenty first, twenty second, twenty fourth, twenty fifth aspects of the invention, wherein the average grain size in the first region is smaller than the average grain size in the first substrate region.

In this electrostatic chuck, the coupling strength between the first porous part and the ceramic dielectric substrate can be improved at the interface between the first porous part and the ceramic dielectric substrate. The average grain size in the first region is small, and the strength of the first porous part is increased. This can suppress detachment of the grains at processing and can reduce particles.

Embodiments of the invention will now be described with reference to the drawings. In the drawings, similar components are marked with the same reference numerals, and the detailed description thereof is omitted appropriately.

First Embodiment

FIG. 1 is a schematic sectional view illustrating an electrostatic chuck according this embodiment.

As shown in FIG. 1, the electrostatic chuck 110 according to this embodiment includes a ceramic dielectric substrate 11, a base plate 50, and a first porous part 90.

The ceramic dielectric substrate 11 is e.g. a flat plate-like base material made of sintered ceramic. For instance, the ceramic dielectric substrate 11 contains aluminum oxide ($Al_2O_3$). For instance, the ceramic dielectric substrate 11 is formed from high-purity aluminum oxide. The concentration of aluminum oxide in the ceramic dielectric substrate 11 is e.g. 99 atomic percent (atomic %) or more and 100 atomic % or less. Use of high-purity aluminum oxide can improve the plasma resistance of the ceramic dielectric substrate 11. The ceramic dielectric substrate 11 has a first major surface 11a on which a suction target W is mounted, and a second major surface 11b on the opposite side from the first major surface 11a. The suction target W is e.g. a semiconductor substrate such as a silicon wafer.

The ceramic dielectric substrate 11 is provided with an electrode 12. The electrode 12 is provided between the first major surface 11a and the second major surface 11b of the ceramic dielectric substrate 11. The electrode 12 is formed so as to be inserted in the ceramic dielectric substrate 11. By application of a suction-holding voltage 80 to the electrode 12, the electrostatic chuck 110 generates charge on the first major surface 11a side of the electrode 12 and suction-holds the target W by electrostatic force.

Here, in the description of this embodiment, the direction from the base plate 50 to the ceramic dielectric substrate 11 is referred to as Z-direction (corresponding to an example of the first direction). One of the directions generally orthogonal to the Z-direction is referred to as Y-direction (corresponding to an example of the second direction). The direction generally orthogonal to the Z-direction and the Y-direction is referred to as X-direction (corresponding to an example of the second direction).

The electrode 12 is shaped like a thin film along the first major surface 11a and the second major surface 11b of the ceramic dielectric substrate 11. The electrode 12 is a suction electrode for suction-holding the target W. The electrode 12 may be of the unipolar type or the bipolar type. The electrode 12 shown in FIG. 1 is of the bipolar type, with electrodes 12 of two polarities provided on the same plane.

The electrode 12 is provided with a connection part 20 extending to the second major surface 11b side of the ceramic dielectric substrate 11. The connection part 20 is e.g. a via (solid type) or via hole (hollow type) in electrical continuity with the electrode 12. The connection part 20 may be a metal terminal connected by a suitable method such as brazing.

The base plate 50 is a member for supporting the ceramic dielectric substrate 11. The ceramic dielectric substrate 11 is fixed on the base plate 50 with a bonding part 60 shown in FIG. 2A. The bonding part 60 can be e.g. a cured silicone adhesive.

The baseplate 50 is e.g. metallic. The baseplate 50 is e.g. divided into an upper part 50a and a lower part 50b made of aluminum. A communication channel 55 is provided between the upper part 50a and the lower part 50b. One end side of the communication channel 55 is connected to an input channel 51. The other end side of the communication channel 55 is connected to an output channel 52.

The baseplate 50 also serves to adjust the temperature of the electrostatic chuck 110. For instance, in the case of cooling the electrostatic chuck 110, a cooling medium is caused to flow in from the input channel 51, to pass through the communication channel 55, and to flow out from the output channel 52. This can absorb heat from the baseplate 50 by the cooling medium to cool the ceramic dielectric substrate 11 attached onto the baseplate 50. On the other hand, in the case of keeping warm the electrostatic chuck 110, a heat-retaining medium can be put into the communication channel 55. Alternatively, a heating element can be incorporated in the ceramic dielectric substrate 11 or the baseplate 50. Thus, the temperature of the baseplate 50 and the ceramic dielectric substrate 11 is adjusted. This can adjust the temperature of the target W suction-held by the electrostatic chuck 110.

Dots 13 are provided as necessary on the first major surface 11a side of the ceramic dielectric substrate 11. A groove 14 is provided between the dots 13. That is, the first major surface 11a is a protrusion-depression surface and includes a depression and a protrusion. The protrusion of the first major surface 11a corresponds to the dot 13. The depression of the first major surface 11a corresponds to the groove 14. The groove 14 extends continuously in the X-Y plane. A space is formed between the back surface of the target W mounted on the electrostatic chuck 110 and the first major surface 11a including the groove 14.

The ceramic dielectric substrate 11 includes a through hole 15 connected to the groove 14. The through hole 15 is provided from the second major surface 11b to the first major surface 11a. That is, the through hole 15 extends in the Z-direction from the second major surface 11b to the first major surface 11a and penetrates through the ceramic dielectric substrate 11.

The height of the dot 13 (the depth of the groove 14), the area ratio between the dots 13 and the grooves 14, the shapes thereof and the like can be appropriately selected to control the temperature of the target W and particles attached to the target W in a desirable state.

The base plate 50 is provided with a gas feed channel 53. For instance, the gas feed channel 53 is provided so as to penetrate through the base plate 50. The gas feed channel 53 may not penetrate through the base plate 50, but may branch halfway from another gas feed channel 53 and extend to the ceramic dielectric substrate 11 side. The gas feed channel 53 may be provided at a plurality of locations in the base plate 50.

The gas feed channel 53 communicates with the through hole 15. That is, the gas (such as helium (He)) flowing into the gas feed channel 53 passes through the gas feed channel 53, and then flows into the through hole 15.

The gas flowing into the through hole 15 passes through the through hole 15, and then flows into the space provided between the target W and the first major surface 11a including the groove 14. This can directly cool the target W with the gas.

The first porous part 90 can be provided at a position e.g. between the base plate 50 and the first major surface 11a of the ceramic dielectric substrate 11 in the Z-direction. The position is opposed to the gas feed channel 53. For instance, the first porous part 90 is provided in the through hole 15 of the ceramic dielectric substrate 11. For instance, the first porous part 90 is inserted into the through hole 15.

Figure 2A:
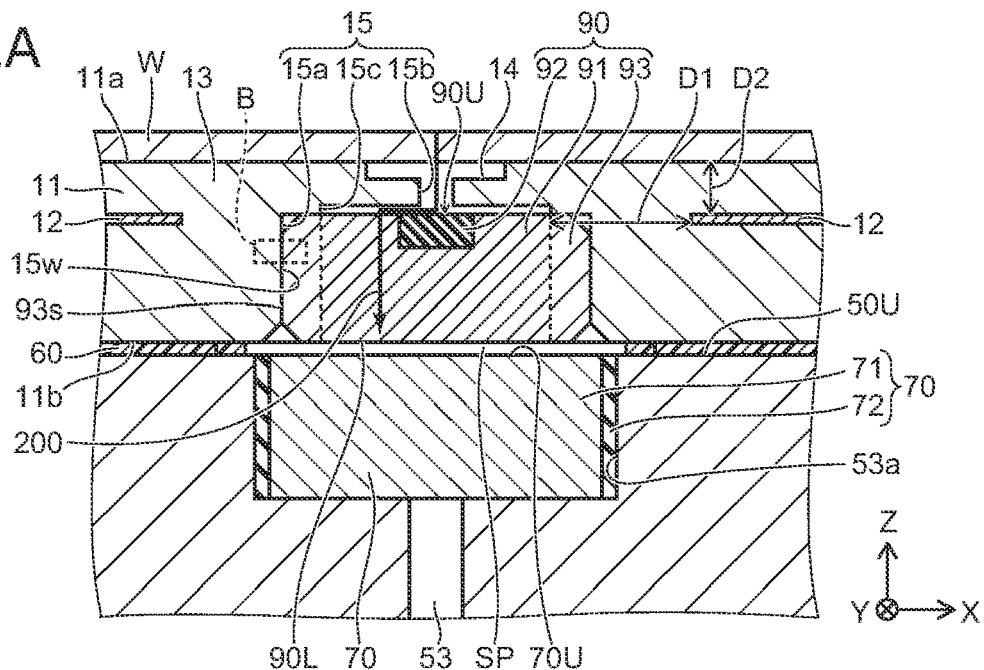
FIGS. 2A and 2B are schematic views illustrating the electrostatic chuck according the embodiment.
Figure 2B:
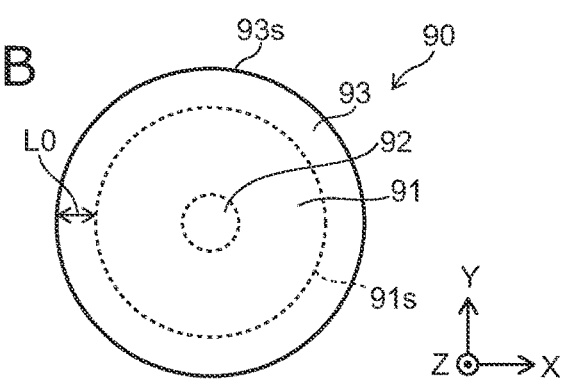

FIGS. 2A and 2B are schematic views illustrating the electrostatic chuck according the embodiment. FIG. 2A illustrates the neighborhood of the first porous part 90. FIG. 2A corresponds to an enlarged view of region A shown in FIG. 1. FIG. 2B is a plan view illustrating the first porous part 90.

Figure 2C:
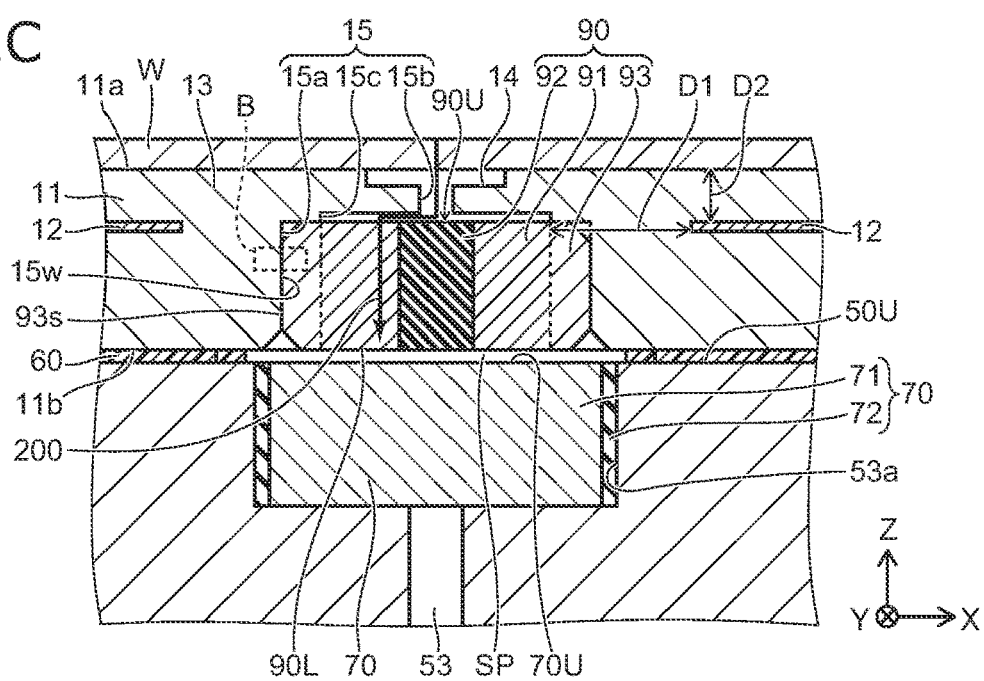
FIG. 2C is a schematic sectional view for illustrating a first compact section according to an alternative embodiment.

FIG. 2C is a schematic sectional view for illustrating a first compact section 92 according to an alternative embodiment.

In order to avoid complexity, the dots 13 (see e.g. FIG. 1) are omitted in FIGS. 2A and 2C.

In this example, the through hole 15 includes a hole part 15a and a hole part 15b (corresponding to an example of the first hole part). One end of the hole part 15a is located on the second major surface 11b of the ceramic dielectric substrate 11.

The ceramic dielectric substrate 11 can include a hole part 15b located between the first major surface 11a and the first porous part 90 in the Z-direction. The hole part 15b communicates with the hole part 15a and extends to the first major surface 11a of the ceramic dielectric substrate 11. That is, one end of the hole part 15b is located on the first major surface 11a (groove 14). The hole part 15b is a link hole for linking the first porous part 90 and the groove 14. The diameter (length along the X-direction) of the hole part 15b is smaller than the diameter (length along the X-direction) of the hole part 15a. Providing a hole part 15b having a small diameter can improve the design flexibility of the space formed between the ceramic dielectric substrate 11 and the target W (e.g. the first major surface 11a including the groove 14). For instance, as shown in FIG. 2A, the width (length along the X-direction) of the groove 14 can be shorter than the width (length along the X-direction) of the first porous part 90. This can suppress discharge in e.g. the space formed between the ceramic dielectric substrate 11 and the target W.

The diameter of the hole part 15b is e.g. 0.05 millimeters (mm) or more and 0.5 mm or less. The diameter of the hole part 15a is e.g. 1 mm or more and 5 mm or less. The hole part 15b may communicate indirectly with the hole part 15a. That is, a hole part 15c (corresponding to an example of the second hole part) may be provided to connect the hole part 15a and the hole part 15b. As shown in FIG. 2A, the hole part 15c can be provided in the ceramic dielectric substrate 11. Alternatively, the hole part 15c can be provided in the first porous part 90. Alternatively, the hole part 15c can be provided in the ceramic dielectric substrate 11 and the first porous part 90. That is, at least one of the ceramic dielectric substrate 11 and the first porous part 90 can include a hole part 15c located between the hole part 15b and the first porous part 90. In this case, when the hole part 15c is provided in the ceramic dielectric substrate 11, the strength around the hole part 15c can be increased, and the occurrence of e.g. chipping can be suppressed around the hole part 15c. This can suppress the occurrence of arc discharge more effectively. When the hole part 15c is provided in the first porous part 90, the hole part 15c is easily aligned with the first porous part 90. This further facilitates the compatibility between reduction of arc discharge and smoothing of the flow of gas. Each of the hole part 15a, the hole part 15b, and the hole part 15c is shaped like e.g. a circular cylinder extending in the Z-direction.

In this case, in the X-direction or the Y-direction, the dimension of the hole part 15c can be made smaller than the dimension of the first porous part 90 and larger than the dimension of the hole part 15b. In the electrostatic chuck 110 according to this embodiment, the first porous part 90 is provided at a position opposed to the gas feed channel 53. This can improve resistance to arc discharge while ensuring the flow rate of the gas flowing in the hole part 15b. The dimension in the X-direction or the Y-direction of the hole part 15c is made larger than the dimension of the hole part 15b. Thus, most of the gas fed into the first porous part 90 having a large dimension can be fed through the hole part 15c into the hole part 15b having a small dimension. That is, reduction of arc discharge can be made compatible with smoothing of the flow of gas.

As described above, the ceramic dielectric substrate 11 includes at least one groove 14 opened to the first major surface 11a and communicating with the first hole part 15. In the Z-direction, the dimension of the hole part 15c can be made smaller than the dimension of the groove 14. Thus, gas can be supplied to the first major surface 11a side through the groove 14. This facilitates supplying gas in a broader range of the first major surface 11a. The dimension in the X-direction or the Y-direction of the hole part 15c is made smaller than the dimension of the groove 14. This can reduce the time taken by the gas to pass through the hole part 15c. That is, the occurrence of arc discharge can be suppressed more effectively while smoothing the flow of gas.

As described above, a bonding part 60 can be provided between the ceramic dielectric substrate 11 and the base plate 50. In the Z-direction, the dimension of the hole part 15c can be made smaller than the dimension of the bonding part 60. This can improve the bonding strength between the ceramic dielectric substrate 11 and the base plate 50. The dimension of the hole part 15c in the Z-direction is made smaller than the dimension of the bonding part 60. Thus, the occurrence of arc discharge can be suppressed more effectively while smoothing the flow of gas.

In this example, the first porous part 90 is provided in the hole part 15a. Thus, the upper surface 90U of the first porous part 90 is not exposed to the first major surface 11a. That is, the upper surface 90U of the first porous part 90 is located between the first major surface 11a and the second major surface 11b. On the other hand, the lower surface 90L of the first porous part 90 is exposed to the second major surface 11b.

The first porous part 90 can include a porous section 91, a first compact section 92, and a second compact section 93.

The porous section 91 includes a plurality of pores. The first compact section 92 is more compact than the porous section 91. As projected on a plane (X-Y plane) perpendicular to a first direction (Z-direction) from the base plate 50 to the ceramic dielectric substrate 11, the first compact section 92 is configured to overlap the first hole part 15b, and the porous section 91 is configured not to overlap the first hole part 15b. In such a configuration, the generated current is caused to flow around the first compact section. Accordingly, the current can be caused to flow a longer distance (conduction path). This can suppress acceleration of electrons, and can suppress the occurrence of arc discharge. In this electrostatic chuck, the occurrence of arc discharge can be effectively suppressed while ensuring the gas flow.

In this example, as projected on the plane perpendicular to the Z-direction, the porous section 91 is provided around the first compact section 92. At a position opposed to the first hole part 15b, the first compact section 92 is placed to improve resistance to arc discharge. On the other hand, the porous section 91 is provided therearound. This can ensure sufficient gas flow. That is, reduction of arc discharge can be made compatible with smoothing of the flow of gas.

The length along the Z-direction of the first compact section 92 may be made smaller than the length along the Z-direction of the first porous part 90. In the Z-direction, the porous section 91 may be provided between the first compact section 92 and the base plate 50. These configurations can smooth the gas flow while suppressing the occurrence of arc discharge.

The length along the Z-direction of the first compact section 92 may be generally equal to the length along the Z-direction of the first porous part 90. The occurrence of arc discharge can be suppressed more effectively by sufficiently increasing the length of the first compact section 92.

The first compact section 92 may be configured as a compact body including substantially no pores. Alternatively, the first compact section 92 may be configured to include a plurality of pores as long as it is more compact than the porous section 91. When the first compact section 92 includes a plurality of pores, preferably, the diameter of the pore is made smaller than the diameter of the pore included in the porous section 91.

The porosity (percent, %) of the first compact section 92 can be made lower than the porosity (%) of the porous section 91. Thus, the density (gram/cubic centimeter, g/cm$^3$) of the first compact section 92 can be made higher than the density (g/cm$^3$) of the porous section 91.

Here, arc discharge often occurs when the current flows inside the hole part 15b from the ceramic dielectric substrate 11 side to the base plate 50 side. Thus, when the first compact section 92 having a low porosity is provided near the hole part 15b, the current 200 is caused to flow around the first compact section 92 as shown in FIG. 2A. Accordingly, the current 200 can be caused to flow a longer distance (conduction path). This can suppress acceleration of electrons, and can suppress the occurrence of arc discharge.

The porosity of the first compact section 92 is e.g. the proportion that the volume of the space (pores) included in the first compact section 92 occupies in the total volume of the first compact section 92. The porosity of the porous section 91 is e.g. the proportion that the volume of the space (pores) included in the porous section 91 occupies in the total volume of the porous section 91. For instance, the porosity of the porous section 91 is 5% or more and 40% or less, and preferably 10% or more and 30% or less. The porosity of the first compact section 92 is 0% or more and 5% or less. In this case, preferably, the porosity of the first compact section 92 is made 50% or less of the porosity of the porous section 91. That is, the first compact section 92 is provided in the porous section 91. The first compact section 92 is opposed to the hole part 15b. The porosity of the first compact section 92 is 50% or less of the porosity of the porous section 91.

The diameter of the pore included in the first compact section 92 may be made 80% or less of the diameter of the pore included in the porous section 91.

Alternatively, the first compact section 92 may be configured to include no pores.

The diameter of the pore included in the first compact section 92 is 80% or less of the diameter of the pore included in the porous section 91, or the first compact section 92 includes no pores. These configurations can also achieve an effect similar to the case of having the aforementioned porosity. That is, even in these cases, the current 200 can be caused to flow a longer distance (conduction path). This can suppress acceleration of electrons, and can suppress the occurrence of arc discharge.

In the Z-direction, the surface of the first compact section 92 on the gas feed channel 53 side may be provided inside the porous section 91, or exposed from the surface of the porous section 91 on the gas feed channel 53 side. The surface of the first compact section 92 on the hole part 15b side may be provided inside the porous section 91, or exposed from the surface of the porous section 91 on the hole part 15b side. When the surface of the first compact section 92 on the hole part 15b side is exposed from the surface of the porous section 91 on the hole part 15b side, the insulation distance can be made longer. This can suppress that the hole part 15b constitutes a path of discharge. When the surface of the first compact section 92 on the gas feed channel 53 side is exposed from the surface of the porous section 91 on the gas feed channel 53 side, the insulation distance can be made longer. This can suppress that the hole part 15b constitutes a path of discharge. For instance, as shown in FIG. 2C, preferably, the first compact section 92 extends in the Z-direction from the surface of the porous section 91 on the gas feed channel 53 side to the surface of the porous section 91 on the hole part 15b side. This can further suppress the occurrence of arc discharge.

As viewed along the Z-direction, preferably, the hole part 15b overlaps the first compact section 92. Then, the current flowing inside the hole part 15b from the ceramic dielectric substrate 11 side to the base plate 50 side can be reliably caused to flow around the first compact section 92. Thus, the insulation distance can be made longer. This can suppress that the hole part 15b constitutes a path of discharge.

The second compact section 93 can be a region including fewer pores than the porous section 91, or a region including substantially no pores. Alternatively, the second compact section 93 may be a porous structure having a smaller pore diameter than the porous section 91. The porosity (percent, %) of the second compact section 93 can be made lower than the porosity (%) of the porous section 91. Thus, the density (gram/cubic centimeter, g/cm$^3$) of the second compact section 93 can be made higher than the density (g/cm$^3$) of the porous section 91. The second compact section 93 is more compact than the porous section 91. Thus, the rigidity (mechanical strength) of the second compact section 93 is higher than the rigidity of the porous section 91.

The porosity of the second compact section 93 is e.g. the proportion that the volume of the space (pores) included in the second compact section 93 occupies in the total volume of the second compact section 93. For instance, the porosity of the second compact section 93 is 0% or more and 5% or less.

The first porous part 90 is shaped like a column (e.g. circular column).

The porous section 91 is shaped like a column (e.g. circular column).

The first compact section 92 is shaped like a plate (e.g. disk) or a column (e.g. circular column).

The second compact section 93 is in contact with the porous section 91, or is continuous (formed integrally) with the porous section 91. As shown in FIG. 2B, as viewed along the Z-direction, the second compact section 93 surrounds the outer periphery of the porous section 91. The second compact section 93 is shaped like a cylinder (e.g. circular cylinder) surrounding the side surface 91s of the porous section 91. In other words, the porous section 91 is provided so as to penetrate through the second compact section 93 in the Z-direction. The gas flowing from the gas feed channel 53 into the through hole 15 passes through a plurality of pores provided in the porous section 91 and is supplied to the groove 14.

Thus, the first porous part 90 includes the porous section 91 as described above. This can improve resistance to arc discharge while ensuring the flow rate of the gas flowing in the through hole 15. The first porous part 90 includes the second compact section 93. This can improve the rigidity (mechanical strength) of the first porous part 90. The first porous part 90 includes the first compact section 92. This can further suppress the occurrence of arc discharge.

For instance, the first porous part 90 is integrated with the ceramic dielectric substrate 11. The state in which two members are integrated refers to the state in which the two members are chemically coupled by e.g. sintering. No material (e.g. adhesive) for fixing one member to the other is provided between the two members. That is, no other member such as adhesive is provided between the first porous part 90 and the ceramic dielectric substrate 11. Thus, the first porous part 90 and the ceramic dielectric substrate 11 are integrated with each other.

More specifically, in the state in which the first porous part 90 and the ceramic dielectric substrate 11 are integrated with each other, the side surface of the first porous part 90 (the side surface 93s of the second compact section 93) is in contact with the inner wall 15w of the through hole 15. The first porous part 90 is supported by the inner wall 15w being in contact with the first porous part 90. Thus, the first porous part 90 is fixed to the ceramic dielectric substrate 11.

For instance, a through hole is provided in a base material constituting the ceramic dielectric substrate 11 before sintering. The first porous part 90 is fitted into the through hole. In this state, by sintering the ceramic dielectric substrate 11 (and the fitted first porous part 90), the first porous part 90 and the ceramic dielectric substrate 11 can be integrated with each other.

Thus, the first porous part 90 is fixed to the ceramic dielectric substrate 11 by integration with the ceramic dielectric substrate 11. This can improve the strength of the electrostatic chuck 110 compared with the case of fixing the first porous part 90 to the ceramic dielectric substrate 11 with e.g. adhesive. For instance, there is no degradation of the electrostatic chuck due to e.g. corrosion or erosion of adhesive.

When the first porous part 90 and the ceramic dielectric substrate 11 are integrated with each other, the side surface of the outer periphery of the first porous part 90 is subjected to a force from the ceramic dielectric substrate 11. On the other hand, when the first porous part 90 is provided with a plurality of pores to ensure the flow rate of gas, the mechanical strength of the first porous part 90 decreases. Thus, when the first porous part is integrated with the ceramic dielectric substrate 11, the first porous part 90 may be broken by the force applied from the ceramic dielectric substrate to the first porous part 90.

In this regard, the first porous part 90 includes the second compact section 93. This can improve the rigidity (mechanical strength) of the first porous part 90. Thus, the first porous part 90 can be integrated with the ceramic dielectric substrate 11.

Figure 12:
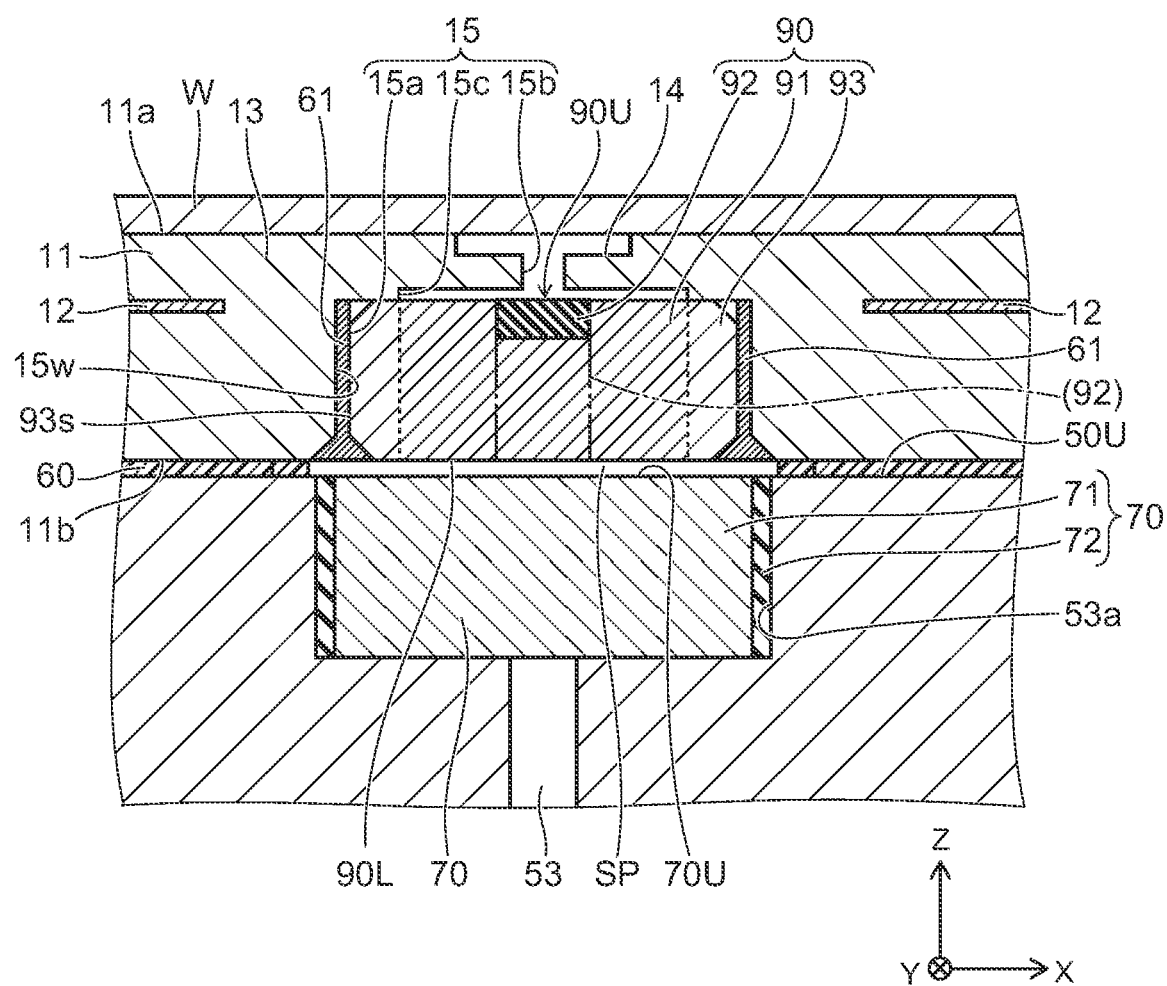
FIG. 12 is a schematic sectional view illustrating an alternative electrostatic chuck according the embodiment.

In the embodiment, the first porous part 90 does not necessarily need to be integrated with the ceramic dielectric substrate 11. For instance, as shown in FIG. 12, the first porous part 90 may be attached to the ceramic dielectric substrate with adhesive.

The second compact section 93 is located between the inner wall 15w of the ceramic dielectric substrate 11 forming the through hole 15, and the porous section 91. That is, the porous section 91 and the first compact section 92 are provided inside the first porous part 90. The second compact section 93 is provided outside the first porous part 90. In the X-direction or the Y-direction, the first compact section 92 is provided in a central region of the porous section 91. The second compact section 93 is provided outside the first porous part 90. This can improve the rigidity against the force applied from the ceramic dielectric substrate 11 to the first porous part 90. Thus, the first porous part 90 and the ceramic dielectric substrate 11 can be easily integrated with each other. For instance, a bonding member 61 (see FIG. 12) may be provided between the first porous part 90 and the ceramic dielectric substrate 11. In this case, the second compact section 93 can suppress that the bonding member 61 is exposed to the gas passing in the first porous part 90. This can suppress degradation of the bonding member 61. The porous section 91 is provided inside the first porous part 90. This can suppress that the through hole 15 of the ceramic dielectric substrate 11 is occluded with the second compact section 93. Thus, the flow rate of gas can be ensured.

The thickness of the second compact section 93 (length L0 between the side surface 91s of the porous section 91 and the side surface 93s of the second compact section 93) is e.g. 100 μm or more and 1000 μm or less.

The material of the first porous part 90 is an insulative ceramic. The first porous part 90 (each of the porous section 91, the first compact section 92, and the second compact section 93) contains at least one of aluminum oxide ($Al_2O_3$), titanium oxide ($TiO_2$), and yttrium oxide ($Y_2O_3$). This can achieve high breakdown voltage and high rigidity of the first porous part 90.

For instance, the first porous part 90 is composed primarily of one of aluminum oxide, titanium oxide, and yttrium oxide.

In this case, the purity of aluminum oxide of the ceramic dielectric substrate 11 can be made higher than the purity of aluminum oxide of the first porous part 90. This can ensure the performance of the electrostatic chuck 110 such as plasma resistance, and ensure the mechanical strength of the first porous part 90. As an example, a trace amount of additive is contained in the first porous part 90. This facilitates sintering the first porous part 90, and can control the pores and ensure the mechanical strength.

In this specification, the ceramic purity of e.g. aluminum oxide of the ceramic dielectric substrate 11 can be measured by e.g. fluorescent X-ray analysis or ICP-AES method (inductively coupled plasma-atomic emission spectrometry).

For instance, the material of the porous section 91, the material of the first compact section 92, and the material of the second compact section 93 are the same. However, the material of the porous section 91, the material of the first compact section 92, and the material of the second compact section 93 may be different. The composition of the material of the porous section 91, the composition of the material of the first compact section 92, and the composition of the material of the second compact section 93 may be different.

As shown in FIG. 2A, the distance D1 in the X-direction or the Y-direction between the porous section 91 (a plurality of sparse portions 94 described later) and the electrode 12 is longer than the distance D2 in the Z-direction between the first major surface 11a and the electrode 12. Thus, the distance D1 in the X-direction or the Y-direction between the porous section 91 provided in the first porous part 90 and the electrode 12 is made longer. This can suppress discharge in the first porous part 90. The distance D2 in the Z-direction between the first major surface 11a and the electrode 12 is made shorter. This can increase the force for sucking the target W mounted on the first major surface 11a.

Figure 3A:
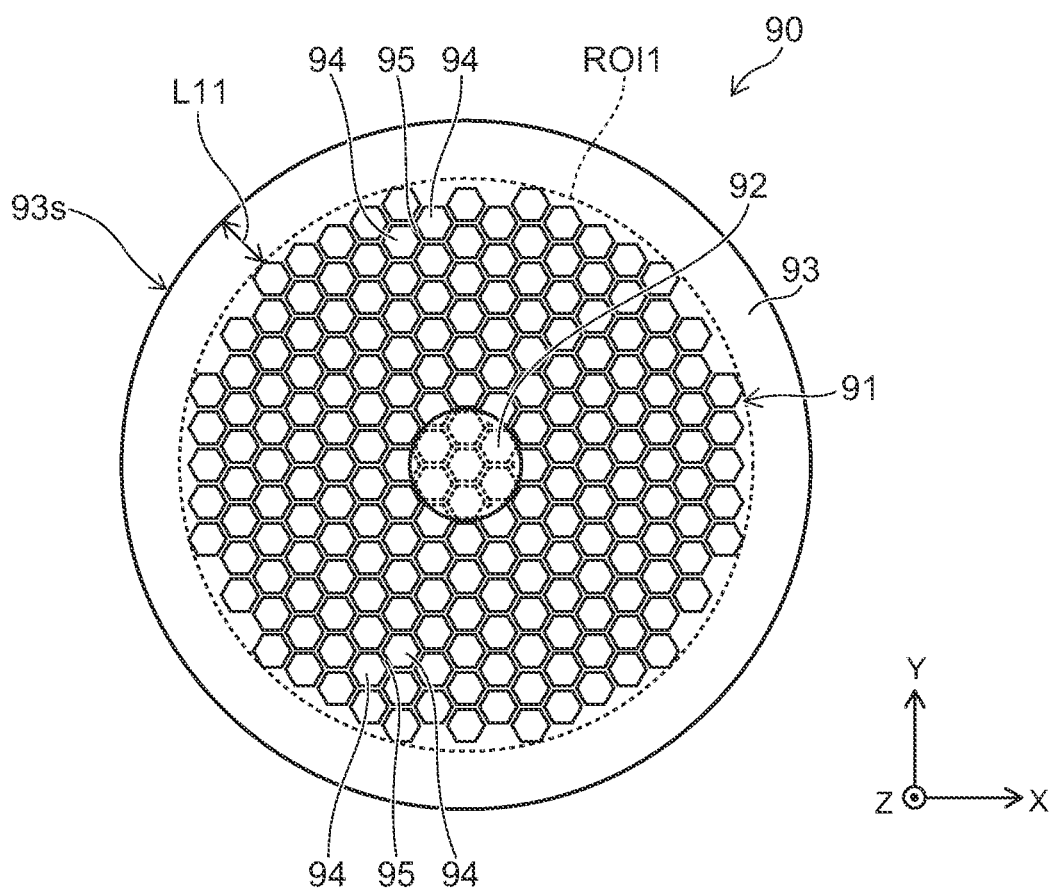
FIGS. 3A and 3B are schematic views illustrating the first porous part of the electrostatic chuck according the embodiment.
Figure 3B:
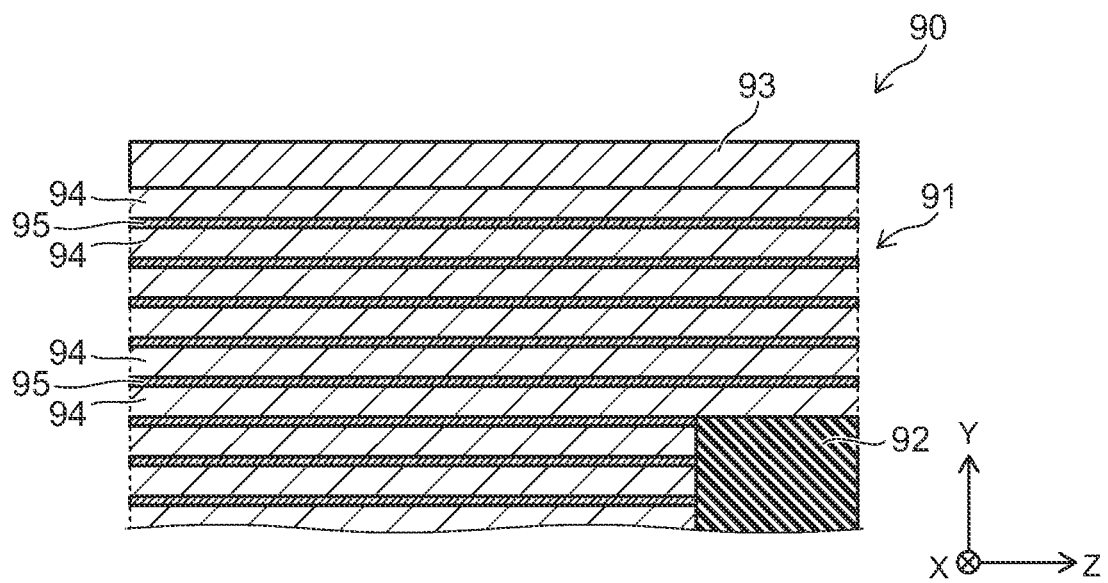

FIGS. 3A and 3B are schematic views illustrating the first porous part of the electrostatic chuck according the embodiment.

FIG. 3A is a plan view of the first porous part 90 as viewed along the Z-direction. FIG. 3B is a sectional view taken along Z-Y plane of the first porous part 90.

As shown in FIGS. 3A and 3B, in this example, the porous section 91 includes a plurality of sparse portions 94 and a dense portion 95. Each of the plurality of sparse portions 94 includes a plurality of pores. The dense portion 95 is more compact than the sparse portion 94. That is, the dense portion 95 is a portion including fewer pores than the sparse portion 94, or a portion including substantially no pores. The porosity of the dense portion 95 is lower than the porosity of the sparse portion 94. Thus, the density of the dense portion 95 is higher than the density of the sparse portion 94. The porosity of the dense portion 95 may be equal to the porosity of the first compact section 92 or the porosity of the second compact section 93. The dense portion 95 is more compact than the sparse portion 94. Thus, the rigidity of the dense portion 95 is higher than the rigidity of the sparse portion 94.

The porosity of one sparse portion 94 is e.g. the proportion that the volume of the space (pores) included in that sparse portion 94 occupies in the total volume of that sparse portion 94. The porosity of the dense portion 95 is e.g. the proportion that the volume of the space (pores) included in the dense portion 95 occupies in the total volume of the dense portion 95. For instance, the porosity of the sparse portion 94 is 20% or more and 60% or less, and preferably 30% or more and 50% or less. The porosity of the dense portion 95 is 0% or more and 5% or less.

Each of the plurality of sparse portions 94 extends in the Z-direction. For instance, each of the plurality of sparse portions 94 is shaped like a column (e.g. circular column or polygonal column) and provided so as to penetrate through the porous section 91 in the Z-direction. The dense portion 95 is located between the plurality of sparse portions 94. The dense portion 95 is shaped like a wall partitioning between the sparse portions 94 neighboring each other. As shown in FIG. 3A, as viewed along the Z-direction, the dense portion 95 is provided so as to surround the outer periphery of each of the plurality of sparse portions 94. The dense portion 95 is continuous with the second compact section 93 at the outer periphery of the porous section 91.

The number of sparse portions 94 provided in the porous section 91 is e.g. 50 or more and 1000 or less. As shown in FIG. 3A, as viewed along the Z-direction, the plurality of sparse portions 94 have a size generally equal to each other. For instance, as viewed along the Z-direction, the plurality of sparse portions 94 are dispersed isotropically and uniformly in the porous section 91. For instance, the distance between the neighboring sparse portions 94 (i.e. the thickness of the dense portion 95) is generally constant.

For instance, as viewed along the Z-direction, the distance L11 between the side surface 93s of the second compact section 93 and the sparse portion 94 of the plurality of sparse portions 94 nearest to the side surface 93s is 100 μm or more and 1000 μm or less.

The porous section 91 may be dispersed with a plurality of pores randomly in three dimensions.

However, the porous section 91 can be provided with a plurality of sparse portions 94, and a dense portion 95 more compact than the sparse portion 94. This can improve the rigidity of the first porous part 90 while ensuring resistance to arc discharge and the flow rate of the gas flowing in the through hole 15 compared with the case where a plurality of pores are dispersed randomly in three dimensions in the porous region.

For instance, the increase of the porosity of the porous region results in increasing the flow rate of gas, but decreasing arc discharge resistance and rigidity. In contrast, by providing the dense portion 95, the decrease of arc discharge resistance and rigidity can be suppressed even when the porosity is increased.

For instance, as viewed along the Z-direction, suppose a minimum circle, ellipse, or polygon containing all the plurality of sparse portions 94. The inside of the circle, ellipse, or polygon can be regarded as the porous section 91. The outside of the circle, ellipse, or polygon can be regarded as the second compact section 93.

As described above, the first porous part 90 can include a plurality of sparse portions 94 and a dense portion 95. The plurality of sparse portions 94 include a plurality of pores 96 including a first pore and a second pore. The dense portion 95 has a higher density than the sparse portion 94. Each of the plurality of sparse portions 94 extends in the Z-direction. The dense portion 95 is located between the plurality of sparse portions 94. The sparse portion 94 includes a wall part 97 provided between the pore 96 (first pore) and the pore 96 (second pore). In the X-direction or the Y-direction, the minimum dimension of the wall part 97 can be made smaller than the minimum dimension of the dense portion 95. Thus, the first porous part 90 is provided with the sparse portions 94 and the dense portion 95 extending in the Z-direction. This can improve the mechanical strength (rigidity) of the first porous part 90 while ensuring arc discharge resistance and gas flow rate. The details of the pore 96 and the wall part 97 will be described later (see FIG. 5).

In the X-direction or the Y-direction, the dimension of the plurality of pores 96 provided in each of the plurality of sparse portions 94 can be made smaller than the dimension of the dense portion 95. Thus, the dimension of the plurality of pores 96 can be made sufficiently small. This can further improve resistance to arc discharge.

The aspect ratio of the plurality of pores 96 provided in each of the plurality of sparse portions 94 can be set to 30 or more and 10000 or less. This can further improve resistance to arc discharge. More preferably, the lower limit of the aspect ratio of the plurality of pores 96 is 100 or more, and the upper limit is 1600 or less.

In the X-direction or the Y-direction, the dimension of the plurality of pores 96 provided in each of the plurality of sparse portions 94 can be set to 1 micrometer or more and 20 micrometers or less. Thus, the pores 96 having a pore dimension of 1-20 micrometers and extending in one direction can be arranged. This can achieve high resistance to arc discharge.

Figure 6A:
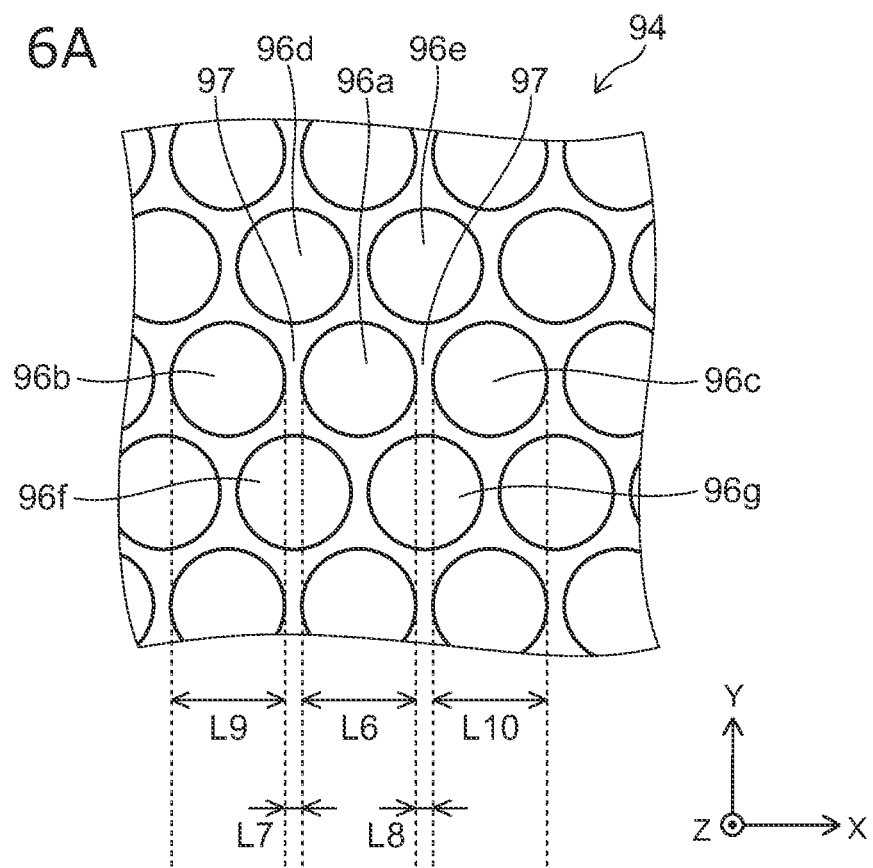
FIGS. 6A and 6B are schematic plan views illustrating the first porous part of the electrostatic chuck according the embodiment.
Figure 6B:
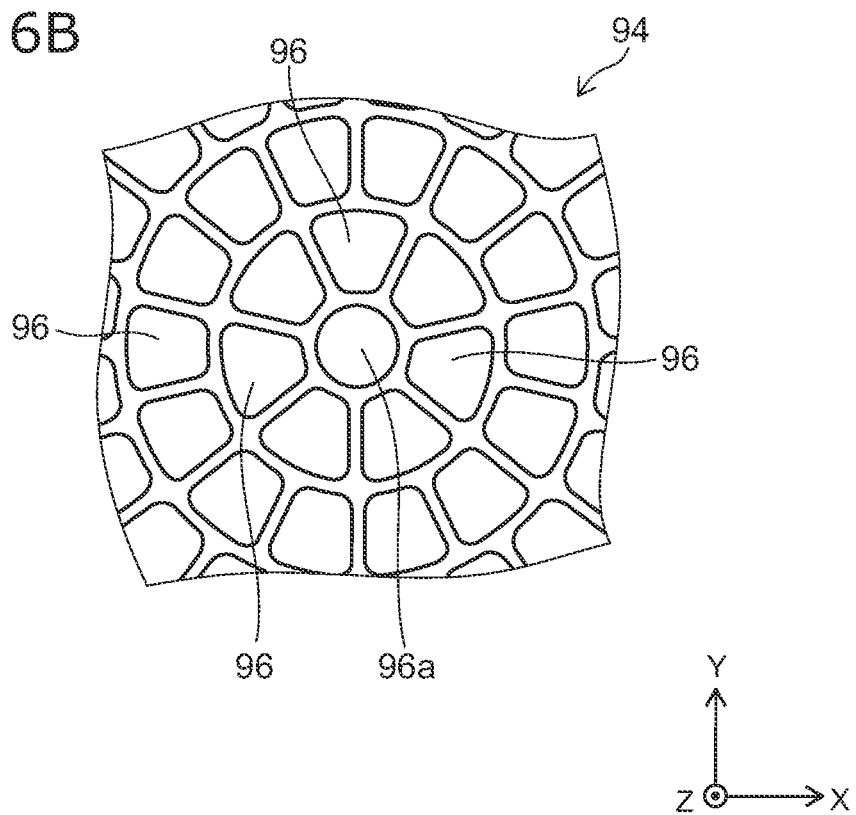

As shown in FIGS. 6A and 6B described later, as viewed along the Z-direction, the first pore 96a is located in a central part of the sparse portion 94. Among the plurality of pores 96, the number of pores 96b-96g neighboring the first pore 96a and surrounding the first pore 96a can be set to 6. Thus, in plan view (as viewed along the Z-direction), a plurality of pores 96 can be arranged with high isotropy and high density. This can improve the rigidity of the first porous part 90 while ensuring arc discharge resistance and gas flow rate.

Figure 4:
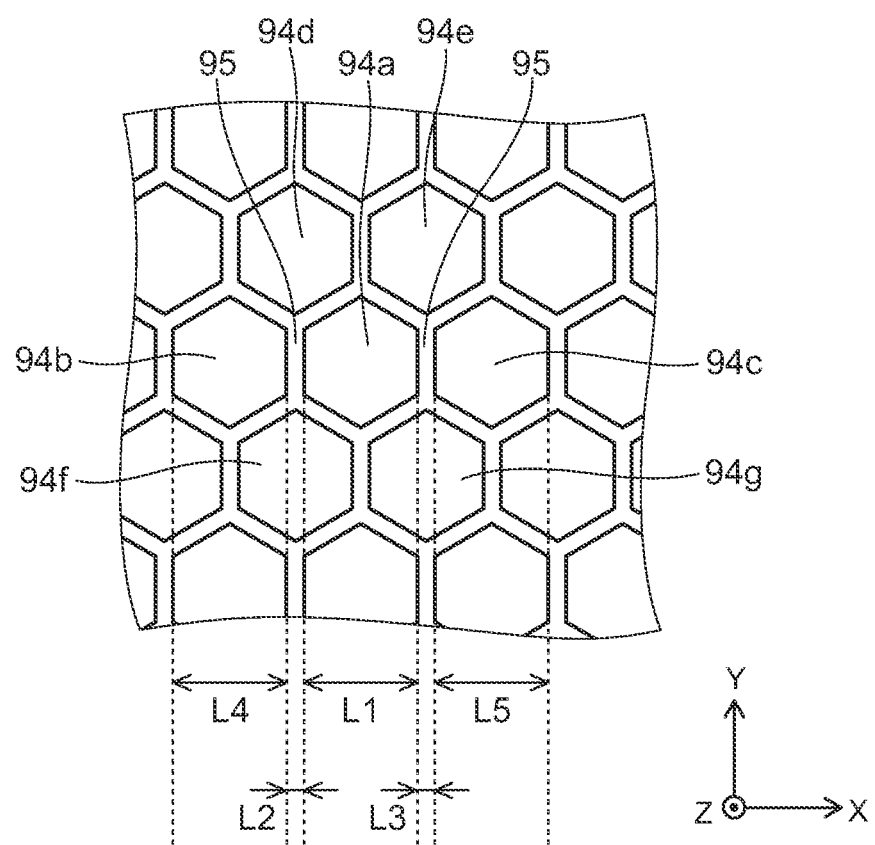
FIG. 4 is a schematic plan view illustrating the first porous part of the electrostatic chuck according the embodiment.

FIG. 4 is a schematic plan view illustrating the first porous part of the electrostatic chuck according the embodiment.

FIG. 4 shows part of the first porous part 90 as viewed along the Z-direction, and corresponds to an enlarged view of FIG. 3A.

As viewed along the Z-direction, each of the plurality of sparse portions 94 is generally shaped like a hexagon (shaped like a generally regular hexagon). As viewed along the Z-direction, the plurality of sparse portions 94 include a first sparse portion 94a and six sparse portions 94 (second to seventh sparse portions 94b-94g) surrounding the first sparse portion 94a.

The second to seventh sparse portions 94b-94g neighbor the first sparse portion 94a. The second to seventh sparse portions 94b-94g are sparse portions 94 of the plurality of sparse portions 94 nearest to the first sparse portion 94a.

The second sparse portion 94b and the third sparse portion 94c are juxtaposed with the first sparse portion 94a in the X-direction. That is, the first sparse portion 94a is located between the second sparse portion 94b and the third sparse portion 94c.

The length L1 along the X-direction of the first sparse portion 94a (the diameter of the first sparse portion 94a) is longer than the length L2 along the X-direction between the first sparse portion 94a and the second sparse portion 94b, and longer than the length L3 along the X-direction between the first sparse portion 94a and the third sparse portion 94c.

Each of the length L2 and the length L3 corresponds to the thickness of the dense portion 95. That is, the length L2 is the length along the X-direction of the dense portion 95 between the first sparse portion 94a and the second sparse portion 94b. The length L3 is the length along the X-direction of the dense portion 95 between the first sparse portion 94a and the third sparse portion 94c. The length L2 and the length L3 are generally equal. For instance, the length L2 is 0.5 times or more and 2.0 times or less of the length L3.

The length L1 is generally equal to the length L4 along the X-direction of the second sparse portion 94b (the diameter of the second sparse portion 94b), and generally equal to the length L5 along the X-direction of the third sparse portion 94c (the diameter of the third sparse portion 94c). For instance, each of the length L4 and the length L5 is 0.5 times or more and 2.0 times or less of the length L1.

Thus, the first sparse portion 94a neighbors and is surrounded with six sparse portions 94 of the plurality of sparse portions 94. That is, as viewed along the Z-direction, in the central part of the porous section 91, the number of sparse portions 94 neighboring one sparse portion 94 is 6. Thus, in plan view (as viewed along the Z-direction), a plurality of sparse portions 94 can be arranged with high isotropy and high density. This can improve the rigidity of the first porous part 90 while ensuring arc discharge resistance and the flow rate of the gas flowing in the through hole 15. This can also suppress variation in arc discharge resistance, variation in the flow rate of the gas flowing in the through hole 15, and variation in the rigidity of the first porous part 90.

The diameter of the sparse portion 94 (e.g. length L1, L4, or L5) is e.g. 50 μm or more and 500 μm or less. The thickness of the dense portion 95 (e.g. length L2 or L3) is e.g. 10 μm or more and 100 μm or less. The diameter of the sparse portion 94 is larger than the thickness of the dense portion 95. The thickness of the dense portion 95 is thinner than the thickness of the second compact section 93.

Figure 5:
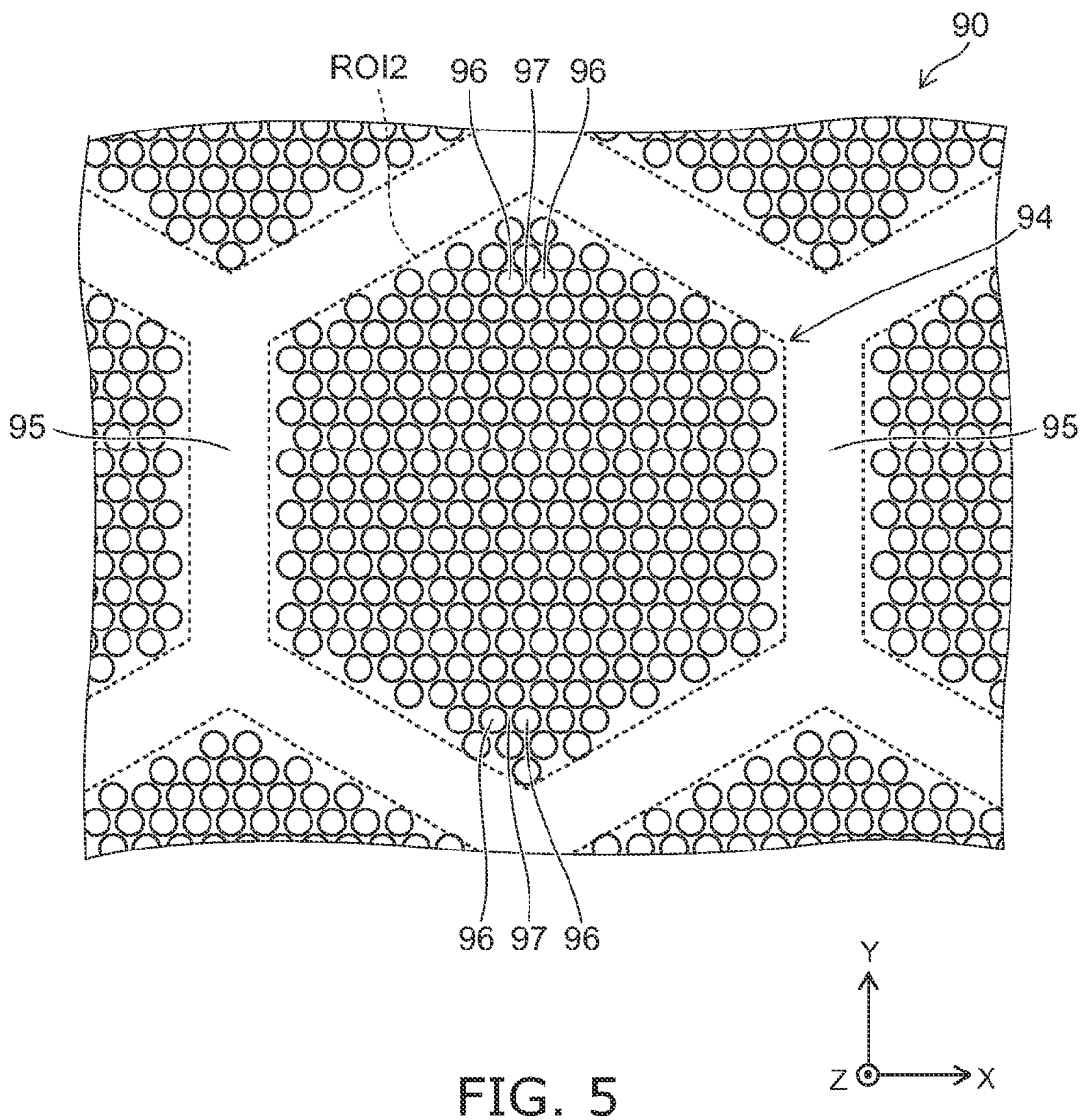
FIG. 5 is a schematic plan view illustrating the first porous part of the electrostatic chuck according the embodiment.

FIG. 5 is a schematic plan view illustrating the first porous part of the electrostatic chuck according the embodiment.

FIG. 5 shows part of the first porous part 90 as viewed along the Z-direction. FIG. 5 is an enlarged view of the neighborhood of one sparse portion 94.

As shown in FIG. 5, in this example, the sparse portion 94 includes a plurality of pores 96 and a wall part 97 provided between the plurality of pores 96.

Each of the plurality of pores 96 extends in the Z-direction. Each of the plurality of pores 96 is shaped like a capillary extending in one direction (one-dimensional capillary structure), and penetrates through the sparse portion 94 in the Z-direction. The wall part 97 is shaped like a wall partitioning the pores 96 neighboring each other. As shown in FIG. 5, as viewed along the Z-direction, the wall part 97 is provided so as to surround the outer periphery of each of the plurality of pores 96. The wall part 97 is continuous with the dense portion 95 at the outer periphery of the sparse portion 94.

The number of pores 96 provided in one sparse portion 94 is e.g. 50 or more and 1000 or less. As shown in FIG. 5, as viewed along the Z-direction, the plurality of pores 96 have a size generally equal to each other. For instance, as viewed along the Z-direction, the plurality of pores 96 are dispersed isotropically and uniformly in the sparse portion 94. For instance, the distance between the neighboring pores 96 (i.e. the thickness of the wall part 97) is generally constant.

Thus, the pores 96 extending in one direction are arranged in the sparse portion 94. This can achieve high resistance to arc discharge with small variation compared with the case where a plurality of pores are dispersed randomly in three dimensions in the sparse portion.

Here, the "capillary structure" of the plurality of pores 96 is further described.

In recent years, for the purpose of high integration of semiconductor devices, the circuit line width is growing narrower, and the circuit pitch is growing finer. The electrostatic chuck is subjected to higher power. The temperature control of the suction target is desired at higher level. Against this background, it is desired to ensure sufficient gas flow rate and to control the flow rate with high accuracy while reliably suppressing arc discharge in high-power environment. The electrostatic chuck 110 according to this embodiment includes a ceramic plug (first porous part 90). The ceramic plug is conventionally provided to prevent arc discharge in the helium supply port (gas feed channel 53). In this embodiment, the pore diameter (the diameter of the pore 96) of the ceramic plug is decreased to the level of e.g. several to several ten μm (the details of the diameter of the pore 96 will be described later). The diameter decreased to this level may make it difficult to control the flow rate of gas. Thus, in the invention, for instance, the shape of the pore 96 is further devised so as to lie along the Z-direction. Specifically, in the conventional art, the flow rate is ensured using a relatively large pore, and its shape is made three-dimensionally complex to achieve prevention of arc discharge. In contrast, in the invention, the dimension of the pore 96 is made finer to the level of e.g. several to several ten μm to achieve prevention of arc discharge. Conversely, its shape is simplified to ensure flow rate. That is, the invention has been conceived based on the idea totally different from the conventional art.

The shape of the sparse portion 94 is not limited to the hexagon, but may be a circle (or ellipse) or other polygons. For instance, as viewed along the Z-direction, suppose a minimum circle, ellipse, or polygon containing all the plurality of pores 96 arranged with a pitch of 10 μm or less. The inside of the circle, ellipse, or polygon can be regarded as the sparse portion 94. The outside of the circle, ellipse, or polygon can be regarded as the dense portion 95.

FIGS. 6A and 6B are schematic plan views illustrating the first porous part of the electrostatic chuck according the embodiment.

FIGS. 6A and 6B show part of the first porous part 90 as viewed along the Z-direction, and are enlarged views showing the pores 96 in one sparse portion 94.

As shown in FIG. 6A, as viewed along the Z-direction, the plurality of pores 96 include a first pore 96a located in the central part of the sparse portion 94, and six pores 96 (second to seventh pores 96b-96g) surrounding the first pore 96a. The second to seventh pores 96b-96g neighbor the first pore 96a. The second to seventh pores 96b-96g are pores 96 of the plurality of pores 96 nearest to the first pore 96a.

The second pore 96b and the third pore 96c are juxtaposed with the first pore 96a in the X-direction. That is, the first pore 96a is located between the second pore 96b and the third pore 96c.

For instance, the length L6 along the X-direction of the first pore 96a (the diameter of the first pore 96a) is longer than the length L7 along the X-direction between the first pore 96a and the second pore 96b, and longer than the length L8 along the X-direction between the first pore 96a and the third pore 96c.

Each of the length L7 and the length L8 corresponds to the thickness of the wall part 97. That is, the length L7 is the length along the X-direction of the wall part 97 between the first pore 96a and the second pore 96b. The length L8 is the length along the X-direction of the wall part 97 between the first pore 96a and the third pore 96c. The length L7 and the length L8 are generally equal. For instance, the length L7 is 0.5 times or more and 2.0 times or less of the length L8.

The length L6 is generally equal to the length L9 along the X-direction of the second pore 96b (the diameter of the second pore 96b), and generally equal to the length L10 along the X-direction of the third pore 96c (the diameter of the third pore 96c). For instance, each of the length L9 and the length L10 is 0.5 times or more and 2.0 times or less of the length L6.

For instance, when the diameter of the pore is small, arc discharge resistance and rigidity are improved. On the other hand, when the diameter of the pore is large, the flow rate of gas can be increased. The diameter of the pore 96 (e.g. length L6, L9, or L10) is e.g. 1 micrometer (μm) or more and 20 μm or less. Thus, pores having a diameter of 1-20 micrometers and extending in one direction are arranged. This can achieve high resistance to arc discharge with small variation. More preferably, the diameter of the pore 96 is 3 μm or more and 10 μm or less.

Here, a method for measuring the diameter of the pore 96 is described. A scanning electron microscope (e.g. Hitachi High-Technologies, S-3000) is used to capture an image with a magnification of 1000 times or more. Commercially available image analysis software is used to calculate 100 circle-equivalent diameters for pores 96. Their average value is used as the diameter of the pore 96.

It is more preferable to suppress variation in the diameter of the plurality of pores 96. By decreasing variation in the diameter, the flow rate of the flowing gas and the breakdown voltage can be controlled more precisely. The variation in the diameter of the plurality of pores 96 can be based on the cumulative distribution of the 100 circle-equivalent diameters obtained in the above calculation of the diameter of the pore 96. Specifically, the concept of particle diameter D50 (median diameter) for the cumulative distribution 50 vol % and particle diameter D90 for the cumulative distribution 90 vol % are applied. These are generally used in granularity distribution measurement. The cumulative distribution graph for the pores 96 is produced in which the horizontal axis represents pore diameter (μm) and the vertical axis represents relative pore amount (%). This graph is used to determine the pore diameter for the cumulative distribution 50 vol % (corresponding to D50 diameter) and the pore diameter for the cumulative distribution 90 vol % (corresponding to D90 diameter). Preferably, the variation in the diameter of the plurality of pores 96 is suppressed so as to satisfy the relation D50:D90≤1:2.

The thickness of the wall part 97 (e.g. length L7 or L8) is e.g. 1 μm or more and 10 μm or less. The thickness of the wall part 97 is thinner than the thickness of the dense portion 95.

Thus, the first pore 96a neighbors and is surrounded with six pores 96 of the plurality of pores 96. That is, as viewed along the Z-direction, in the central part of the sparse portion 94, the number of pores 96 neighboring one pore 96 is 6. Thus, in plan view, a plurality of pores 96 can be arranged with high isotropy and high density. This can improve the rigidity of the first porous part 90 while ensuring arc discharge resistance and the flow rate of the gas flowing in the through hole 15. This can also suppress variation in arc discharge resistance, variation in the flow rate of the gas flowing in the through hole 15, and variation in the rigidity of the first porous part 90.

FIG. 6B shows an alternative example of the arrangement of the plurality of pores 96 in the sparse portion 94. As shown in FIG. 6B, in this example, the plurality of pores 96 are arranged concentrically about the first pore 96a. Thus, in plan view, a plurality of pores can be arranged with high isotropy and high density.

The first porous part 90 having the structure as described above can be manufactured using e.g. extrusion molding. Each of the lengths L0-L10 can be measured by observation using a microscope such as a scanning electron microscope.

The evaluation of porosity in this specification is described. In this description, the evaluation of porosity in the first porous part 90 is taken as an example.

An image like the plan view of FIG. 3A is captured. Image analysis is used to calculate the proportion R1 of the plurality of sparse portions 94 occupied in the porous section 91. The image is captured using a scanning electron microscope (e.g. Hitachi High-Technologies, S-3000). A BSE image is captured at an acceleration voltage of 15 kV and a magnification of 30 times. For instance, the image size is 1280×960 pixels, and the image gray scale assumes 256 levels.

The proportion R1 of the plurality of sparse portions 94 occupied in the porous section 91 is calculated using image analysis software (e.g. Win-ROOF Ver. 6.5 (Mitani Corporation)).

Calculation of the proportion R1 using Win-ROOF Ver. 6.5 can be performed as follows.

The evaluation range ROI1 (see FIG. 3A) is set to the minimum circle (or ellipse) including all the sparse portions 94.

Binarization by a single threshold (e.g. 0) is performed to calculate the area S1 of the evaluation range ROI1.

Binarization by two thresholds (e.g. 0 and 136) is performed to calculate the total area S2 of the plurality of sparse portions 94 in the evaluation range ROI1. At this time, filling in the sparse portions 94 and deletion of regions having a small area regarded as noise (threshold being 0.002 or less) are performed. The two thresholds are appropriately adjusted by the brightness and contrast of the image.

The proportion R1 is calculated as the proportion of the area S2 to the area S1. That is, the proportion R1 is given by proportion R1 (%)=(area S2)/(area S1)×100.

In the embodiment, the proportion R1 of the plurality of sparse portions 94 occupied in the porous section 91 is e.g. 40% or more and 70% or less, and preferably 50% or more and 70% or less. The proportion R1 is e.g. approximately 60%.

An image like the plan view of FIG. 5 is captured. Image analysis is used to calculate the proportion R2 of the plurality of pores 96 occupied in the sparse portion 94. The proportion R2 corresponds to e.g. the porosity of the sparse portion 94. The image is captured using a scanning electron microscope (e.g. Hitachi High-Technologies, S-3000). A BSE image is captured at an acceleration voltage of 15 kV and a magnification of 600 times. For instance, the image size is 1280×960 pixels, and the image gray scale assumes 256 levels.

The proportion R2 of the plurality of pores 96 occupied in the sparse portion 94 is calculated using image analysis software (e.g. Win-ROOF Ver. 6.5 (Mitani Corporation)).

Calculation of the proportion R2 using Win-ROOF Ver. 6.5 can be performed as follows.

The evaluation range ROI2 (see FIG. 5) is set to a hexagon approximating the shape of the sparse portion 94. The evaluation range ROI2 includes all the pores 96 provided in one sparse portion 94.

Binarization by a single threshold (e.g. 0) is performed to calculate the area S3 of the evaluation range ROI2.

Binarization by two thresholds (e.g. 0 and 96) is performed to calculate the total area S4 of the plurality of pores 96 in the evaluation range ROI2. At this time, filling in the pores 96 and deletion of regions having a small area regarded as noise (threshold being 1 or less) are performed. The two thresholds are appropriately adjusted by the brightness and contrast of the image.

The proportion R2 is calculated as the proportion of the area S4 to the area S3. That is, the proportion R2 is given by proportion R2 (%)=(area S4)/(area S3)×100.

In the embodiment, the proportion R2 of the plurality of pores 96 occupied in the sparse portion 94 (the porosity of the sparse portion 94) is e.g. 20% or more and 60% or less, and preferably 30% or more and 50% or less. The proportion R2 is e.g. approximately 40%.

The porosity of the porous section 91 corresponds to e.g. the product of the proportion R1 of the plurality of sparse portions 94 occupied in the porous section 91 and the proportion R2 of the plurality of pores 96 occupied in the sparse portion 94. For instance, when the proportion R1 is 60% and the proportion R2 is 40%, the porosity of the porous section 91 can be calculated as approximately 24%.

Thus, the first porous part 90 includes a porous section 91 having the porosity as described above. This can improve breakdown voltage while ensuring the flow rate of the gas flowing in the through hole 15.

Likewise, the porosity of the ceramic dielectric substrate and the second porous part 70 can be calculated. Preferably, the magnification of the scanning electron microscope is appropriately selected within the range of several ten times to several thousand times depending on the observation target.

Figure 7A:
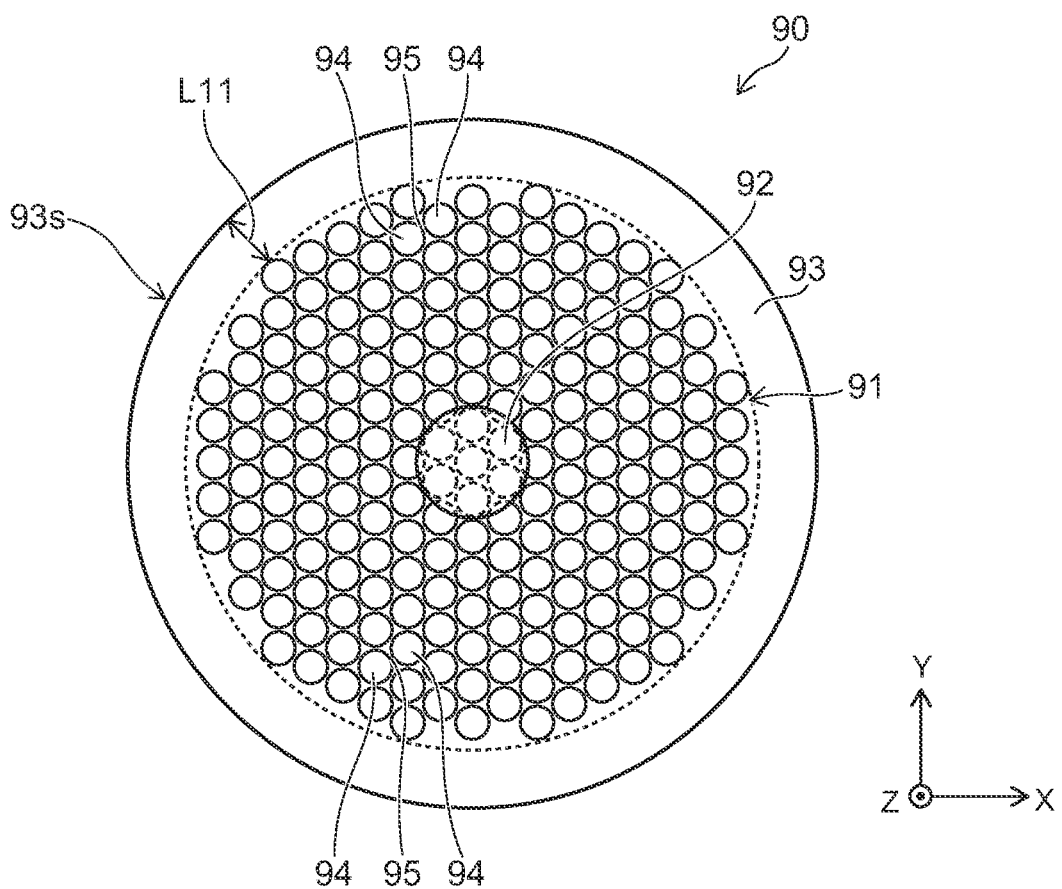
FIGS. 7A and 7B are schematic views illustrating an alternative first porous part according the embodiment.
Figure 7B:
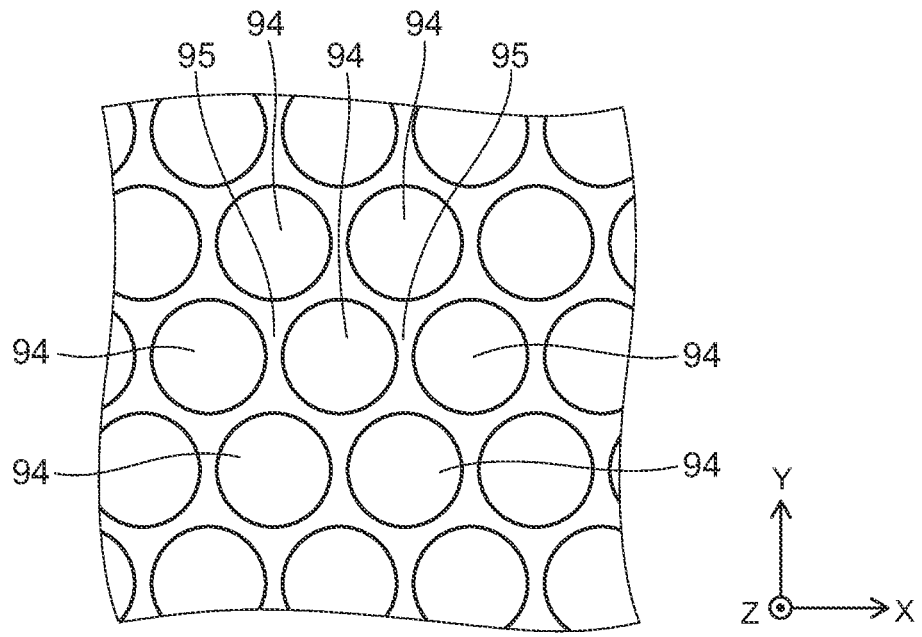

FIGS. 7A and 7B are schematic views illustrating an alternative first porous part according the embodiment.

FIG. 7A is a plan view of the first porous part 90 as viewed along the Z-direction. FIG. 7B corresponds to an enlarged view of part of FIG. 7A.

As shown in FIGS. 7A and 7B, in this example, the planar shape of the sparse portion 94 is circular. Thus, the planar shape of the sparse portion 94 does not need to be hexagonal.

Figure 8:
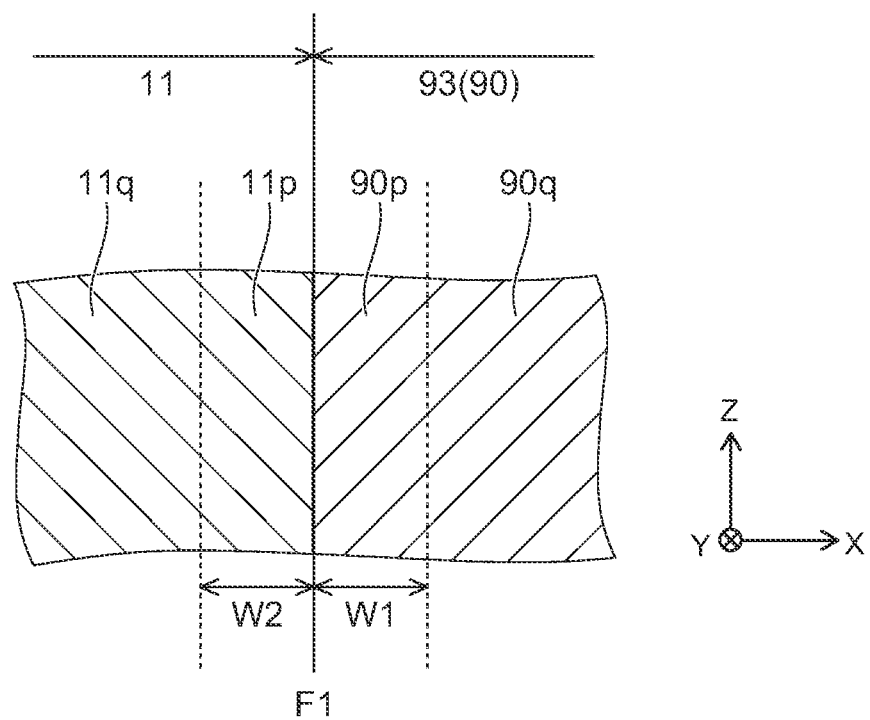
FIG. 8 is a schematic sectional view illustrating the electrostatic chuck according the embodiment.

FIG. 8 is a schematic sectional view illustrating the electrostatic chuck according the embodiment.

FIG. 8 corresponds to an enlarged view of region B shown in FIG. 2. That is, FIG. 8 shows the neighborhood of the interface F1 between the first porous part 90 (second compact section 93) and the ceramic dielectric substrate 11. In this example, the material of the first porous part 90 and the ceramic dielectric substrate 11 is aluminum oxide.

As shown in FIG. 8, the first porous part 90 includes a first region 90p located on the ceramic dielectric substrate 11 side in the X-direction or the Y-direction, and a second region 90q continuous with the first region 90p in the X-direction or the Y-direction. The first region 90p and the second region 90q are part of the second compact section 93 of the first porous part 90.

The first region 90p is located between the second region 90q and the ceramic dielectric substrate 11 in the X-direction or the Y-direction. The first region 90p is a region of approximately 40-60 μm in the X-direction or the Y-direction from the interface F1. That is, the width W1 along the X-direction or the Y-direction of the first region 90p (the length of the first region 90p in the direction perpendicular to the interface F1) is e.g. 40 μm or more and 60 μm or less.

The ceramic dielectric substrate 11 includes a first substrate region 11p located on the first porous part 90 (first region 90p) side in the X-direction or the Y-direction, and a second substrate region 11q continuous with the first substrate region 11p in the X-direction or the Y-direction. The first region 90p and the first substrate region 11p are provided in contact with each other. The first substrate region 11p is located between the second substrate region 11q and the first porous part 90 in the X-direction or the Y-direction. The first substrate region 11p is a region of approximately 40-60 μm in the X-direction or the Y-direction from the interface F1. That is, the width W2 along the X-direction or the Y-direction of the first substrate region 11p (the length of the first substrate region 11p in the direction perpendicular to the interface F1) is e.g. 40 μm or more and 60 μm or less.

Figure 9A:
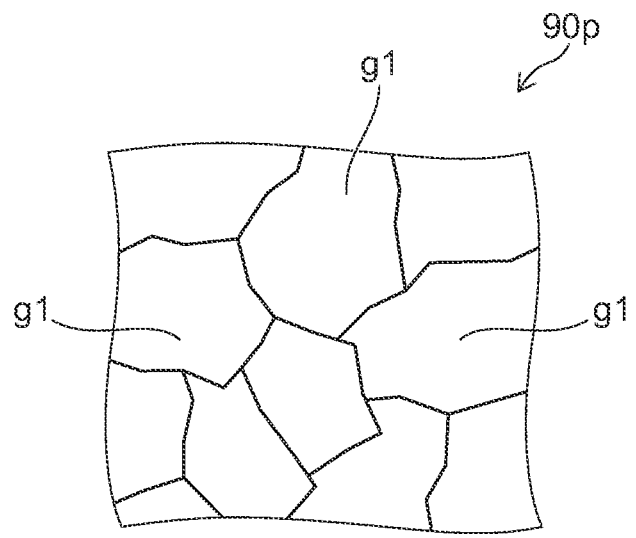
FIGS. 9A and 9B are schematic sectional views illustrating the electrostatic chuck according the embodiment.
Figure 9B:
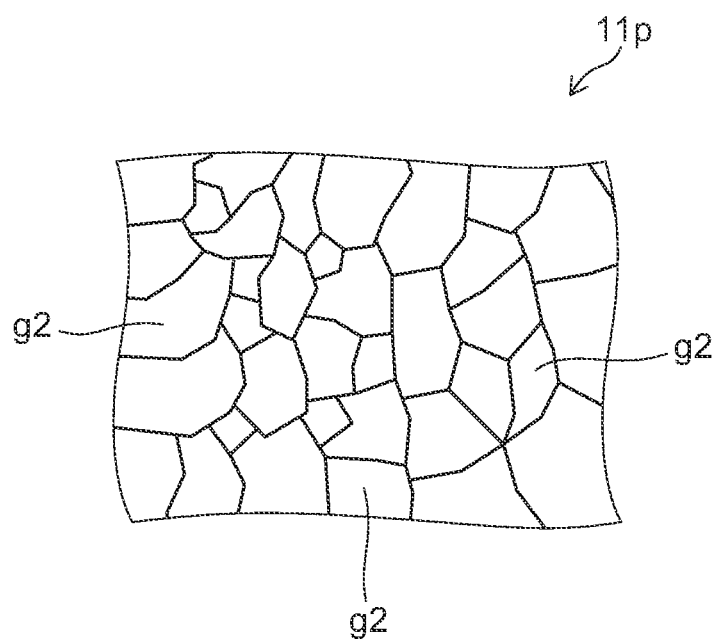

FIGS. 9A and 9B are schematic sectional views illustrating the electrostatic chuck according the embodiment.

FIG. 9A is an enlarged view of part of the first region 90p shown in FIG. 8. FIG. 9B is an enlarged view of part of the first substrate region 11p shown in FIG. 8.

As shown in FIG. 9A, the first region 90p includes a plurality of grains g1 (crystal grains). As shown in FIG. 9B, the first substrate region 11p includes a plurality of grains g2 (crystal grains).

The average grain size in the first region 90p (the average value of the diameter of the plurality of grains g1) is different from the average grain size in the first substrate region 11p (the average value of the diameter of the plurality of grains g2).

Thus, the average grain size in the first region 90p is different from the average grain size in the first substrate region 11p. This can improve the coupling strength (interfacial strength) between the crystal grain of the first porous part 90 and the crystal grain of the ceramic dielectric substrate 11 at the interface F1. For instance, this can suppress peeling of the first porous part 90 from the ceramic dielectric substrate 11 and removal of crystal grains.

The average grain size can be the average value of the circle-equivalent diameter of the crystal grain in the cross-sectional image as shown in FIGS. 9A and 9B. The circle-equivalent diameter is the diameter of a circle having an area equal to the area of the target planar shape.

Preferably, the ceramic dielectric substrate 11 and the first porous part 90 are integrated with each other. The first porous part 90 is fixed to the ceramic dielectric substrate 11 by integration with the ceramic dielectric substrate 11. This can improve the strength of the electrostatic chuck compared with the case of fixing the first porous part 90 to the ceramic dielectric substrate 11 with e.g. adhesive. For instance, this can suppress the degradation of the electrostatic chuck due to e.g. corrosion or erosion of adhesive.

In this example, the average grain size in the first substrate region 11p is smaller than the average grain size in the first region 90p. The small grain size in the first substrate region 11p can improve the coupling strength between the first porous part and the ceramic dielectric substrate at the interface between the first porous part and the ceramic dielectric substrate. The small grain size in the first substrate region can increase the strength of the ceramic dielectric substrate 11 and suppress the risk of e.g. cracks due to stress produced during manufacturing or processing. For instance, the average grain size in the first region 90p is 3 μm or more and 5 μm or less. For instance, the average grain size in the first substrate region 11p is 0.5 μm or more and 2 μm or less. The average grain size in the first substrate region 11p is 1.1 times or more and 5 times or less of the average grain size in the first region 90p.

For instance, the average grain size in the first substrate region 11p is smaller than the average grain size in the second substrate region 11q. In the first substrate region 11p provided in contact with the first region 90p, preferably, the interfacial strength with the first region 90p is increased by interaction such as diffusion with the first region 90p during e.g. sintering in the manufacturing process. On the other hand, in the second substrate region 11q, preferably, the material of the ceramic dielectric substrate 11 develops its intrinsic characteristics. Thus, the average grain size in the first substrate region 11p is made smaller than the average grain size in the second substrate region 11q. Accordingly, ensuring the interfacial strength in the first substrate region 11p can be made compatible with the characteristics of the ceramic dielectric substrate 11 in the second substrate region 11q.

The average grain size in the first region 90p may be smaller than the average grain size in the first substrate region 11p. This can improve the coupling strength between the first porous part and the ceramic dielectric substrate at the interface between the first porous part and the ceramic dielectric substrate. The small grain size in the first region 90p increases the strength of the first porous part 90. This can suppress removal of grains during processing and reduce particles.

For instance, in each of the first porous part 90 and the ceramic dielectric substrate 11, the average grain size can be adjusted by adjusting the composition of materials and the sintering condition such as temperature. For instance, the amount or concentration of the sintering aid added in sintering the ceramic material is adjusted. For instance, magnesium oxide (MgO) used as a sintering aid suppresses abnormal growth of crystal grains.

Similarly to the foregoing, the average grain size in the first region 90p can be made smaller than the average grain size in the second substrate region 11q. This can improve mechanical strength in the first region 90p.

Referring again to FIG. 2A, the structure of the electrostatic chuck 110 is further described. The electrostatic chuck 110 may further include a second porous part 70. The second porous part 70 can be provided between the first porous part 90 and the gas feed channel 53 in the Z-direction. For instance, the second porous part 70 is fitted into the ceramic dielectric substrate 11 side of the base plate 50. As shown in FIG. 2A, for instance, a countersink part 53a is provided on the ceramic dielectric substrate 11 side of the base plate 50. The countersink part 53a is provided like a cylinder. The second porous part 70 is fitted into the countersink part 53a by appropriately designing the inner diameter of the countersink part 53a.

The upper surface 70U of the second porous part 70 is exposed to the upper surface 50U of the base plate 50. The upper surface 70U of the second porous part 70 is opposed to the lower surface 90L of the first porous part 90. In this example, a space SP is formed between the upper surface 70U of the second porous part 70 and the lower surface 90L of the first porous part 90. The space SP may be filled with at least one of the second porous part 70 and the first porous part 90. That is, the second porous part 70 and the first porous part 90 may be in contact with each other.

The second porous part 70 includes a ceramic porous body 71 including a plurality of pores, and a ceramic insulating film 72. The ceramic porous body 71 is provided like a cylinder (e.g. circular cylinder) and fitted into the countersink part 53a. The shape of the second porous part 70 is preferably a circular cylinder, but is not limited to a circular cylinder. The ceramic porous body 71 is made of an insulative material. The material of the ceramic porous body 71 is e.g. $Al_2O_3$, $Y_2O_3$, $ZrO_2$, MgO, SiC, AlN, or $Si_3N_4$. The material of the ceramic porous body 71 may be glass such as $SiO_2$. The material of the ceramic porous body 71 may be e.g. $Al_2O_3$—$TiO_2$, $Al_2O_3$—MgO, $Al_2O_3$—$SiO_2$, $Al_6O_{13}Si_2$, YAG, or $ZrSiO_4$.

The porosity of the ceramic porous body 71 is e.g. 20% or more and 60% or less. The density of the ceramic porous body 71 is e.g. 1.5 g/cm$^3$ or more and 3.0 g/cm$^3$ or less. The gas such as He flowing from the gas feed channel 53 passes through a plurality of pores of the ceramic porous body 71 and is fed from the through hole 15 provided in the ceramic dielectric substrate 11 to the groove 14.

The ceramic insulating film 72 is provided between the ceramic porous body 71 and the gas feed channel 53. The ceramic insulating film 72 is more compact than the ceramic porous body 71. The porosity of the ceramic insulating film 72 is e.g. 10% or less. The density of the ceramic insulating film 72 is e.g. 3.0 g/cm$^3$ or more and 4.0 g/cm$^3$ or less. The ceramic insulating film 72 is provided on the side surface of the ceramic porous body 71.

The material of the ceramic insulating film 72 is e.g. $Al_2O_3$, $Y_2O_3$, $ZrO_2$, or MgO. The material of the ceramic insulating film 72 may be e.g. $Al_2O_3$—$TiO_2$, $Al_2O_3$—MgO, $Al_2O_3$—$SiO_2$, $Al_6O_{13}Si_2$, YAG, or $ZrSiO_4$.

The ceramic insulating film 72 is formed on the side surface of the ceramic porous body 71 by thermal spraying. In thermal spraying, a coating material is melted or softened by heating and turned to fine particles. The fine particles are accelerated and caused to impinge on the side surface of the ceramic porous body 71. Thus, the flattened particles are solidified or deposited to form a coating. This method is referred to as thermal spraying. Alternatively, the ceramic insulating film 72 may be fabricated by e.g. PVD (physical vapor deposition), CVD, sol-gel method, or aerosol deposition method. When the ceramic insulating film 72 is formed from a ceramic by thermal spraying, the film thickness is e.g. 0.05 mm or more and 0.5 mm or less.

The porosity of the ceramic dielectric substrate 11 is e.g. 1% or less. The density of the ceramic dielectric substrate 11 is e.g. 4.2 g/cm$^3$.

The porosity in the ceramic dielectric substrate 11 and the second porous part 70 is measured by a scanning electron microscope as described above. The density is measured based on JIS C 2141 5.4.3.

The second porous part 70 is fitted in the countersink part 53a of the gas feed channel 53. Then, the ceramic insulating film 72 is in contact with the base plate 50. That is, the ceramic porous body 71 and the ceramic insulating film 72 having high insulation performance are interposed between the through hole 15 for guiding the gas such as He to the groove 14 and the metallic base plate 50. Use of such a second porous part 70 can achieve higher insulation performance than in the case where only the ceramic porous body 71 is provided in the gas feed channel 53.

In the X-direction or the Y-direction, the dimension of the second porous part 70 can be made larger than the dimension of the first porous part 90. A higher breakdown voltage can be obtained by providing such a second porous part 70. This can suppress the occurrence of arc discharge more effectively.

The plurality of pores provided in the second porous part 70 are further dispersed in three dimensions than the plurality of pores provided in the first porous part 90. The proportion of pores penetrating in the Z-direction can be made higher in the first porous part 90 than in the second porous part 70. A higher breakdown voltage can be obtained by providing the second porous part 70 including a plurality of pores dispersed in three dimensions. This can suppress the occurrence of arc discharge more effectively. The flow of gas can be smoothed by providing the first porous part 90 having a high proportion of pores penetrating in the Z-direction.

In the Z-direction, the dimension of the second porous part 70 can be made larger than the dimension of the first porous part 90. Thus, a higher breakdown voltage can be obtained. This can suppress the occurrence of arc discharge more effectively.

The average value of the diameter of the plurality of pores provided in the second porous part 70 can be made larger than the average value of the diameter of the plurality of pores provided in the first porous part 90. Thus, the second porous part 70 having a large pore diameter is provided. This can smooth the flow of gas. The first porous part 90 having a small pore diameter is provided on the suction target side. This can suppress the occurrence of arc discharge more effectively.

Variation in the diameter of the plurality of pores can be decreased. This can suppress arc discharge more effectively.

Figure 10:
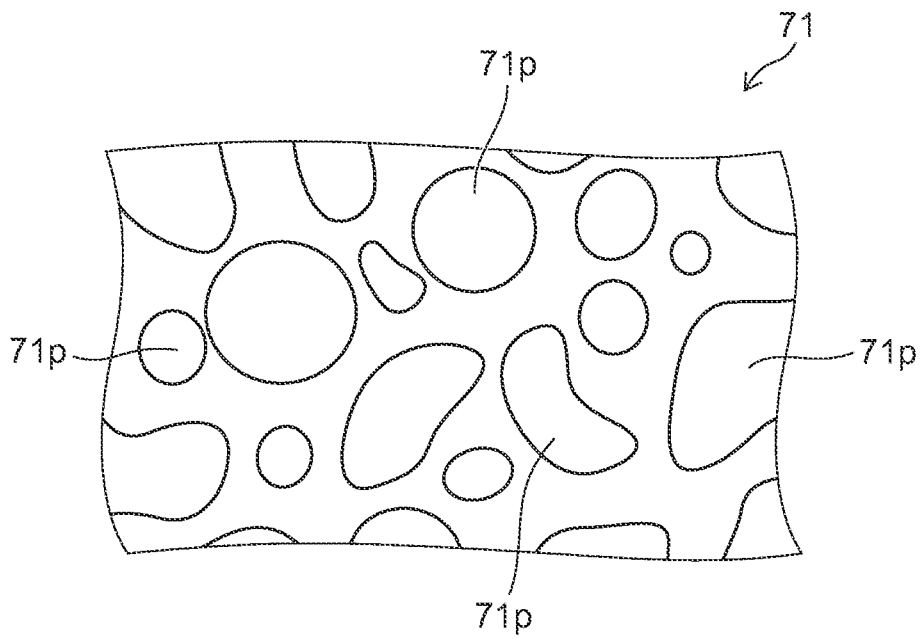
FIG. 10 is a schematic sectional view illustrating the second porous part of the electrostatic chuck according the embodiment.

FIG. 10 is a schematic sectional view illustrating the second porous part 70 of the electrostatic chuck according the embodiment.

FIG. 10 is an enlarged view of part of the cross section of the ceramic porous body 71.

A plurality of pores 71p provided in the ceramic porous body 71 are dispersed in three dimensions in the X-direction, the Y-direction, and the Z-direction inside the ceramic porous body 71. In other words, the ceramic porous body 71 has a three-dimensional network structure spread in the X-direction, the Y-direction, and the Z-direction. The plurality of pores 71p are dispersed in the ceramic porous body 71 e.g. randomly or uniformly.

The plurality of pores 71p are dispersed in three dimensions. Thus, part of the plurality of pores 71p are exposed to the surface of the ceramic porous body 71. Accordingly, fine irregularities are formed at the surface of the ceramic porous body 71. That is, the ceramic porous body 71 has a rough surface. The surface roughness of the ceramic porous body 71 can facilitate forming the ceramic insulating film 72 as a thermal spray film. For instance, this improves contact between the thermal spray film and the ceramic porous body 71. Peeling of the ceramic insulating film 72 can be suppressed.

The average value of the diameter of the plurality of pores 71p provided in the ceramic porous body 71 is larger than the average value of the diameter of the plurality of pores 96 provided in the porous section 91. The diameter of the pore 71p is e.g. 10 μm or more and 50 μm or less. The porous section 91 having a small pore diameter can control (limit) the flow rate of the gas flowing in the through hole 15. This can suppress variation in the gas flow rate caused by the ceramic porous body 71. The diameter of the pore 71p and the diameter of the pore 96 can be measured by a scanning electron microscope as described above.

The average value of the diameter of the plurality of pores 71p provided in the ceramic porous body 71 can be smaller than the average value of the diameter of the plurality of pores 96 provided in the porous section 91. This causes a current to flow hardly. This can suppress the occurrence of arc discharge more effectively.

The average value of the diameter of the plurality of pores 71p may be appropriately determined under consideration of the flow rate of gas to ne necessary and suppression of arc discharge.

Figure 11:
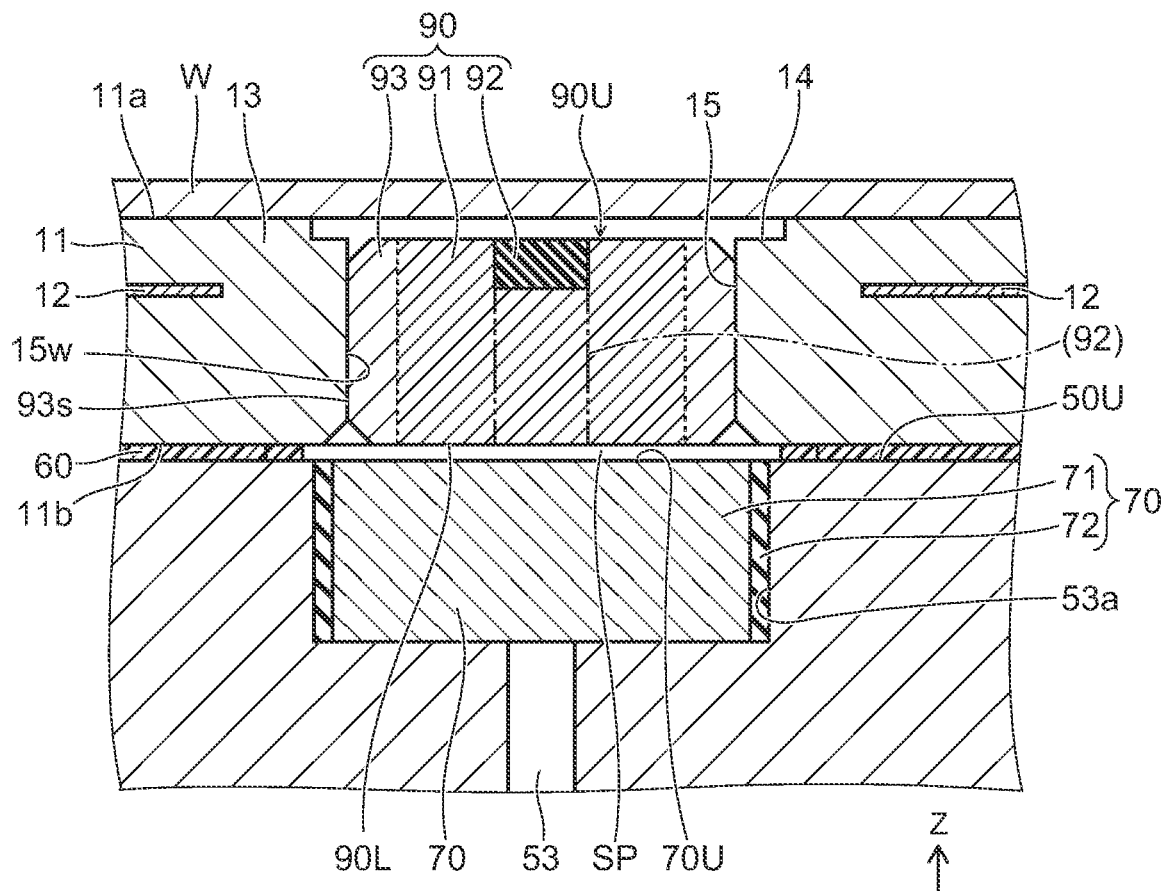
FIG. 11 is a schematic sectional view illustrating an alternative electrostatic chuck according the embodiment.

FIG. 11 is a schematic sectional view illustrating an alternative electrostatic chuck according the first embodiment.

FIG. 11 illustrates the neighborhood of the first porous part 90 as in FIG. 2A.

In this example, the through hole 15 provided in the ceramic dielectric substrate 11 is not provided with the hole part 15b (the link hole for linking the first porous part 90 and the groove 14). For instance, the diameter (length along the X-direction) of the through hole 15 is generally constant without changing in the Z-direction.

As shown in FIG. 11, at least part of the upper surface 90U of the first porous part 90 is exposed to the first major surface 11a side of the ceramic dielectric substrate 11. For instance, the position in the Z-direction of the upper surface 90U of the first porous part 90 is the same as the position in the Z-direction of the bottom of the groove 14.

Thus, the first porous part 90 may be provided generally entirely in the through hole 15. The through hole 15 is not provided with a link hole having a small diameter. This can increase the flow rate of the gas flowing in the through hole 15. The first porous part 90 having high insulation performance can be placed in most of the through hole 15. This can achieve high resistance to arc discharge.

FIG. 12 is a schematic sectional view illustrating an alternative electrostatic chuck according the first embodiment.

FIG. 12 illustrates the neighborhood of the first porous part 90 as in FIG. 2A.

In this example, the first porous part 90 is not integrated with the ceramic dielectric substrate 11.

A bonding member 61 (adhesive) is provided between the first porous part 90 and the ceramic dielectric substrate 11. The first porous part 90 is bonded to the ceramic dielectric substrate 11 with the bonding member 61. For instance, the bonding member 61 is provided between the side surface of the first porous part 90 (the side surface 93s of the second compact section 93) and the inner wall 15w of the through hole 15. The first porous part 90 and the ceramic dielectric substrate 11 do not need to be in contact with each other.

The bonding member 61 is e.g. a silicone adhesive. The bonding member 61 is e.g. an elastic member having elasticity. The elastic modulus of the bonding member 61 is e.g. lower than the elastic modulus of the second compact section 93 of the first porous part 90, and lower than the elastic modulus of the ceramic dielectric substrate 11.

In the structure in which the first porous part 90 and the ceramic dielectric substrate 11 are bonded by the bonding member 61, the bonding member 61 can be used as a cushioning material against the difference between the thermal contraction of the first porous part 90 and the thermal contraction of the ceramic dielectric substrate 11.

Second Embodiment

Figure 13A:
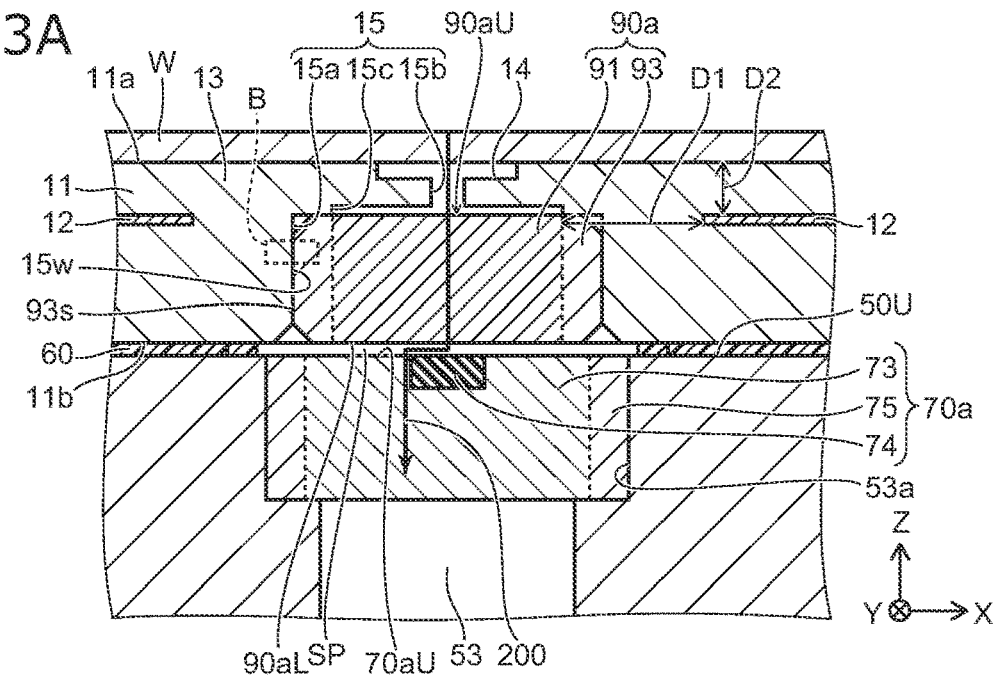
FIG. 13A is a schematic cross sectional view illustrating an electrostatic chuck according to a second embodiment.

FIG. 13A is a schematic cross sectional view illustrating an electrostatic chuck according to the second embodiment.

Figure 13B:
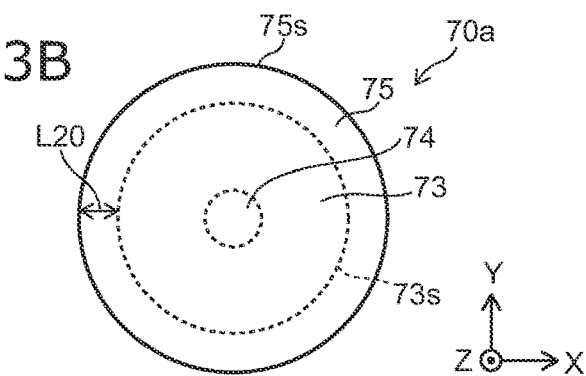
FIG. 13B is a plan view illustrating a second porous part.

FIG. 13B is a plan view illustrating a second porous part 70a.

Figure 13C:
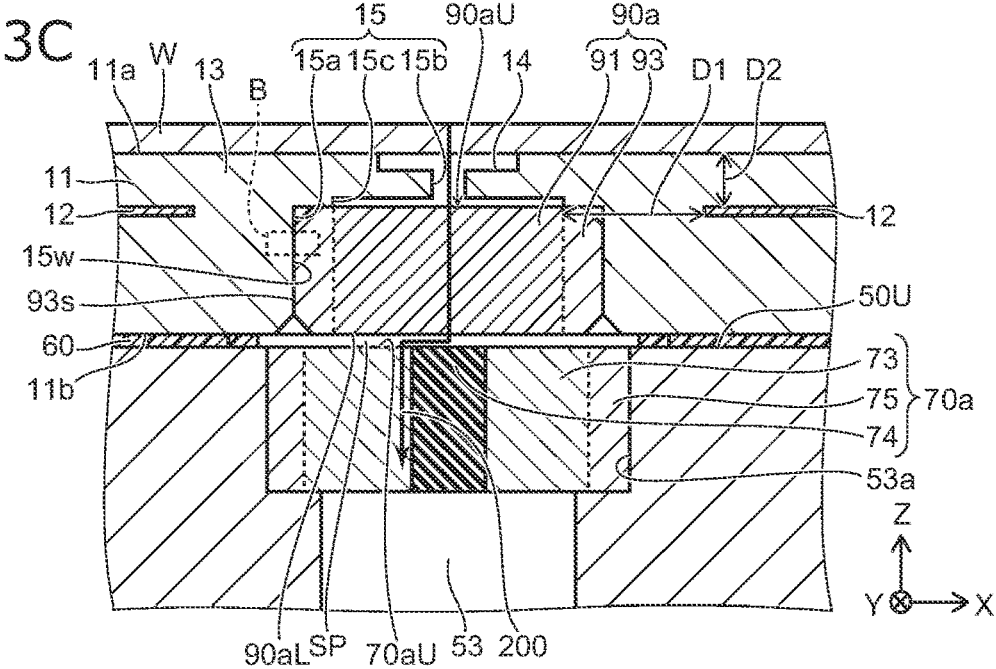
FIG. 13C is a schematic cross sectional view illustrating a modification of the electrostatic chuck according to the second embodiment.

FIG. 13C is a schematic cross sectional view illustrating a modification of the electrostatic chuck according to the second embodiment.

In the case of the electrostatic chuck according to the first embodiment, the first compact section 92 is provided in the first porous part 90. On the other hand, in the case of the electrostatic chuck according to the second embodiment, a third compact section 74 is provided in the second porous part 70a. Components other than this can be the same as the case of the electrostatic chuck according to the first embodiment.

Therefore, FIGS. 13A to 13C can be corresponded to FIGS. 2A to 2C, respectively.

As shown in FIGS. 13A to 13C, the first porous part 90a is provided with the porous section 91 and the second compact section 93. The first porous part 90a is not provided with the first compact section 92.

The second porous part 70a can include a ceramic porous body 73 (second porous section), a third compact section 74, and a fourth compact section 75.

The ceramic porous body 73 can be, for instance, the same as the ceramic porous body 71 described above.

As described above, arc discharge often occurs when the current flows inside the hole part 15b from the ceramic dielectric substrate 11 side to the base plate 50 side. Thus, when the first compact section 92 having a low porosity is provided near the hole part 15b, the current 200 is caused to flow around the third compact section 74 as shown in FIG. 13A. Accordingly, the current 200 can be caused to flow a longer distance (conduction path). This can suppress acceleration of electrons, and can suppress the occurrence of arc discharge.

The fourth compact section 75 can be, for instance, the same as the second compact section 93 described above.

The fourth compact section 75 is in contact with the ceramic porous body 73 or continuous with the ceramic porous body 73 (formed integrally). As shown in FIG. 13B, as viewed along the Z-direction, the fourth compact section 75 surrounds the outer periphery of the ceramic porous body 73. The fourth compact section 75 is shaped like a cylinder (e.g. circular cylinder) surrounding the side surface 73s of the ceramic porous body 73. In other words, the ceramic porous body 73 is provided so as to penetrate through the fourth compact section 75 in the Z-direction. The gas flowing from the gas feed channel 53 into the second porous part 70a passes through a plurality of pores provided in the ceramic porous body 73 and is supplied to the first porous part 90a.

Thus, the second porous part 70a includes the ceramic porous body 73 as described above. This can improve resistance to arc discharge while ensuring the flow rate of the gas flowing in the through hole 15. The second porous part 70a includes the fourth compact section 75. This can improve the rigidity (mechanical strength) of the second porous part 70a. The second porous part 70a includes the third compact section 74. This can further suppress the occurrence of arc discharge.

For instance, the first porous part 90a is integrated with the ceramic dielectric substrate 11. The state in which two members are integrated refers to the state in which the two members are chemically coupled by e.g. sintering. No material (e.g. adhesive) for fixing one member to the other is provided between the two members. That is, no other member such as adhesive is provided between the first porous part 90a and the ceramic dielectric substrate 11. Thus, the first porous part 90a and the ceramic dielectric substrate 11 are integrated with each other.

More specifically, in the state in which the first porous part 90a and the ceramic dielectric substrate 11 are integrated with each other, the side surface of the first porous part 90a (the side surface 93s of the second compact section 93) is in contact with the inner wall 15w of the through hole 15. The first porous part 90a is supported by the inner wall 15w being in contact with the first porous part 90a. Thus, the first porous part 90a is fixed to the ceramic dielectric substrate 11.

For instance, a through hole is provided in a base material constituting the ceramic dielectric substrate 11 before sintering. The first porous part 90a is fitted into the through hole. In this state, by sintering the ceramic dielectric substrate 11 (and the fitted first porous part 90a), the first porous part 90a and the ceramic dielectric substrate 11 can be integrated with each other.

Thus, the first porous part 90a is fixed to the ceramic dielectric substrate 11 by integration with the ceramic dielectric substrate 11. This can improve the strength of the electrostatic chuck 110 compared with the case of fixing the first porous part 90a to the ceramic dielectric substrate 11 with e.g. adhesive. For instance, there is no degradation of the electrostatic chuck due to e.g. corrosion or erosion of adhesive.

When the first porous part 90a and the ceramic dielectric substrate 11 are integrated with each other, the side surface of the outer periphery of the first porous parta 90 is subjected to a force from the ceramic dielectric substrate 11. On the other hand, when the first porous part 90a is provided with a plurality of pores to ensure the flow rate of gas, the mechanical strength of the first porous part 90a decreases. Thus, when the first porous part 90a is integrated with the ceramic dielectric substrate 11, the first porous part 90a may be broken by the force applied from the ceramic dielectric substrate 11 to the first porous part 90a.

In this regard, the first porous part 90a includes the second compact section 93. This can improve the rigidity (mechanical strength) of the first porous part 90a. Thus, the first porous part 90a can be integrated with the ceramic dielectric substrate 11.

Figure 19:
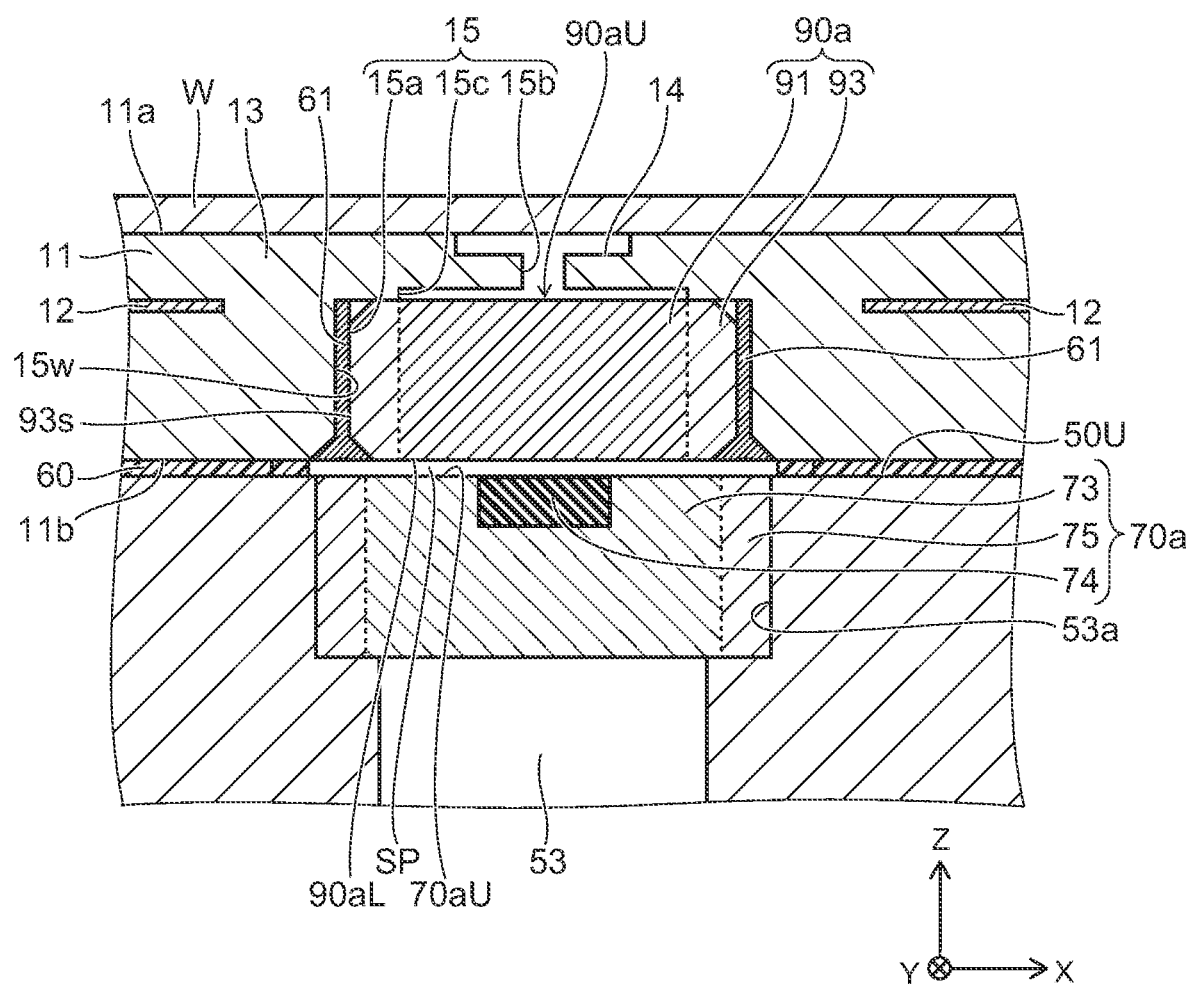
FIG. 19 is a schematic cross sectional view illustrating another electrostatic chuck according to the second embodiment.

In the embodiment, the first porous part 90a does not necessarily need to be integrated with the ceramic dielectric substrate 11. For instance, as shown in FIG. 19, the first porous part 90a may be attached to the ceramic dielectric substrate 11 with adhesive.

Figure 14:
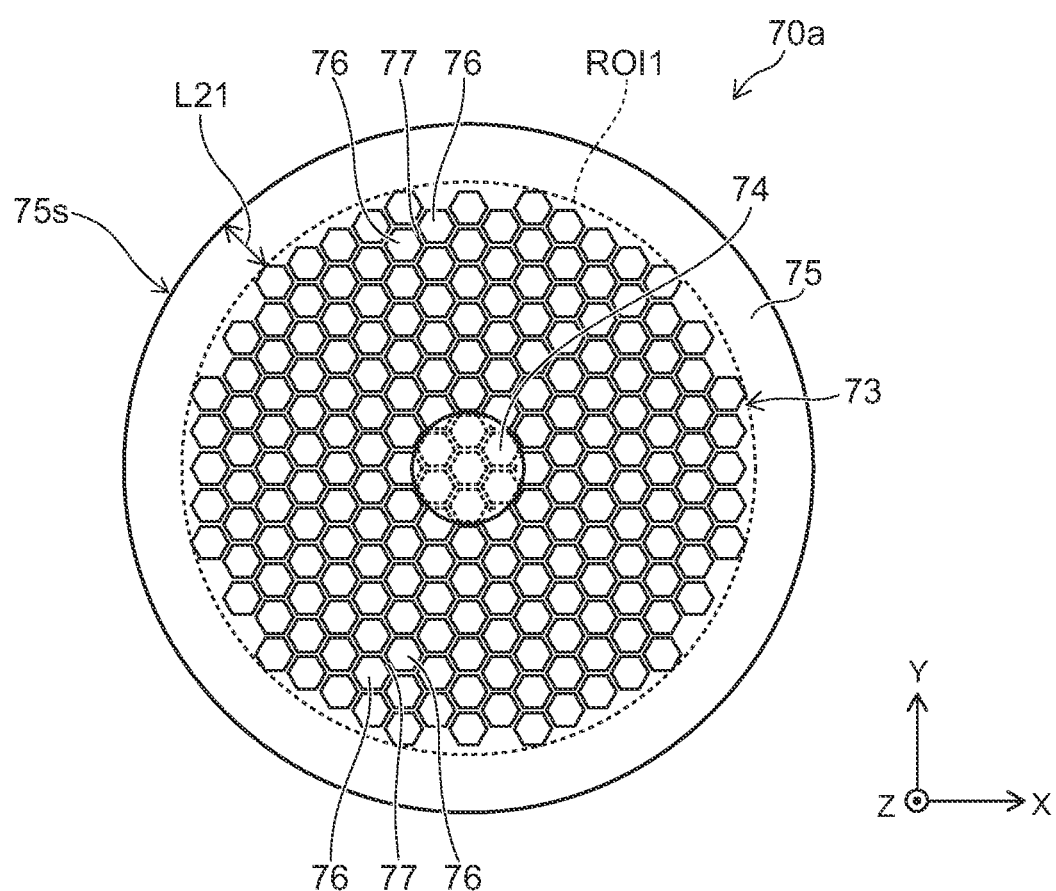
FIG. 14 is a schematic view illustrating the second porous part.

FIG. 14 is a schematic view illustrating the second porous part 70a. FIG. 14 is a plan view of the second porous part 70a when viewed along the Z-direction.

As shown in FIG. 14, the ceramic porous body 73 includes a plurality of sparse portions 76 and a dense portion 77. Each of the plurality of sparse portions 76 includes a plurality of pores. The dense portion 77 is more compact than the sparse portion 76. That is, the dense portion 77 is a portion including fewer pores than the sparse portion 76, or a portion including substantially no pores. The configuration of the second porous part 70a can be the same as the configuration of the first porous part 90 described above. In this case, the ceramic porous body 73 can correspond to the porous section 91, the fourth compact section 75 can correspond to the second compact section 93, the sparse portions 76 can correspond to the sparse portions 94, and the dense portion 77 can correspond to the dense portion 95. Therefore, the detailed description is omitted.

In this example, in the case where the first porous part 90a is integrated with the ceramic dielectric substrate 11 and the configuration of the second porous part 70a is the same as the configuration of the first porous part 90 described above, when the average value of the plurality of pores of the first porous part 90a is larger than the average value of the plurality of pores of the second porous part 70a, the mechanical strength of the first porous part 90a can be increased more, and the high arc resistance and the strength can be compatible.

As viewed along the Z-direction, a distance L21 between the side surface 75s of the fourth compact section 75 and the sparse portion 76 nearest to the side surface 75s of the plurality of sparse portions 76 can be not less than 100 μm and not more than 1000 μm.

Figure 15:
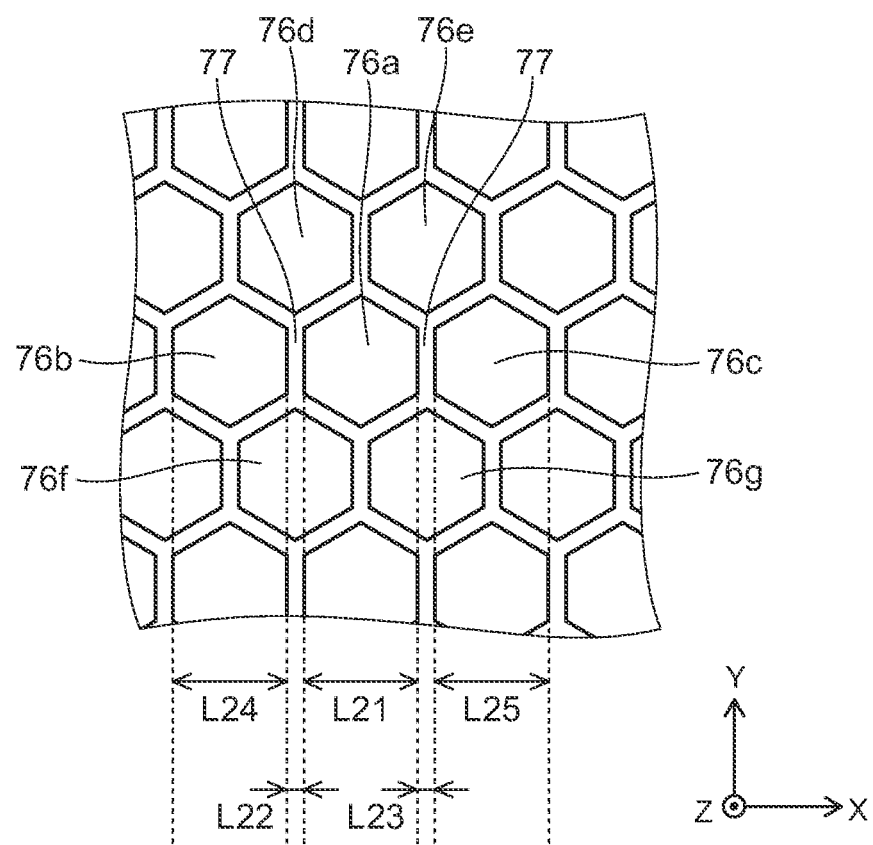
FIG. 15 is an enlarged view showing a part of the second porous portion viewed along the Z-direction.

FIG. 15 shows a part of the second porous part 70a viewed along the Z-direction, and corresponds to an enlarged view of FIG. 14.

As viewed along the Z-direction, each of the plurality of sparse portions 76 is generally shaped like a hexagon (shaped like a generally regular hexagon). As viewed along the Z-direction, the plurality of sparse portions 76 include a first sparse portion 76a and six sparse portions 76 (second to seventh sparse portions 76b-76g) surrounding the first sparse portion 76a. As described above, other than the first compact section 92 and the third compact section 74, the configuration of the second porous part 70a can be the same as the configuration of the first porous part 90. In this case, the sparse portions 76a to 76g can correspond to the sparse portions 94a to 94g. The lengths L21 to L25 can correspond to the lengths L1 to L5. Therefore, the detailed description of these is omitted.

Figure 16:
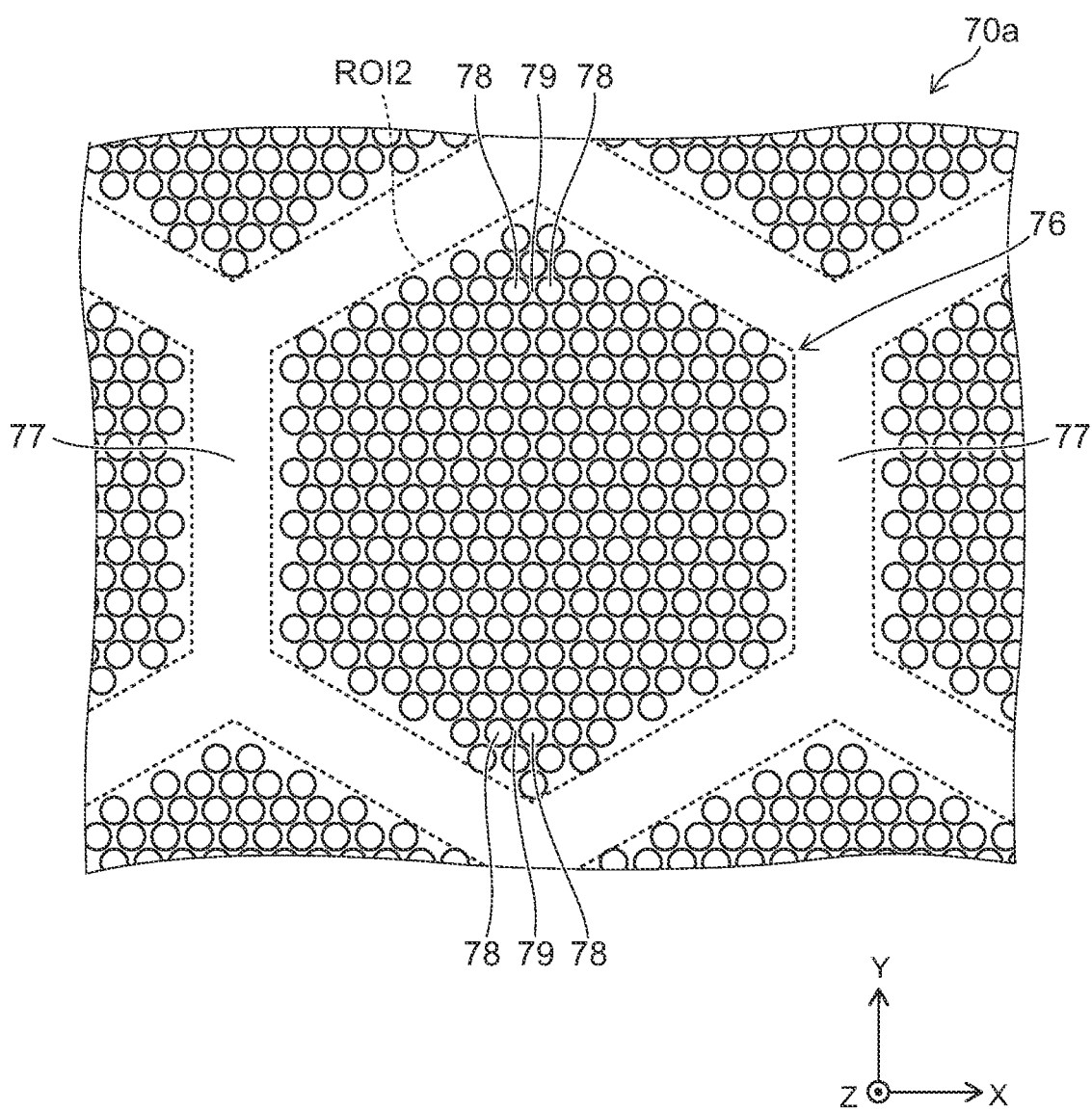
FIG. 16 is an enlarged view of a neighborhood of one sparse portion.

FIG. 16 shows a part of the second porous pet 70a viewed along the Z-direction. FIG. 16 is an enlarged view of the neighborhood of one sparse portion 76.

As shown in FIG. 16, in this example, the sparse portions 76 include a plurality of pores 78 and a wall part 79 provided between the plurality of pores 78. As described above, other than the first compact section 92 and the third compact section 74, the configuration of the second porous part 70a can be the same as the configuration of the first porous part 90. In this case, the sparse portions 76 can correspond to the sparse portions 94, the dense portion 77 can corresponds to the dense portion 95, the pores 78 can correspond to the pores 96, and the wall part 79 can corresponds to the wall part 97. Therefore, the detailed description is omitted.

Figure 17:
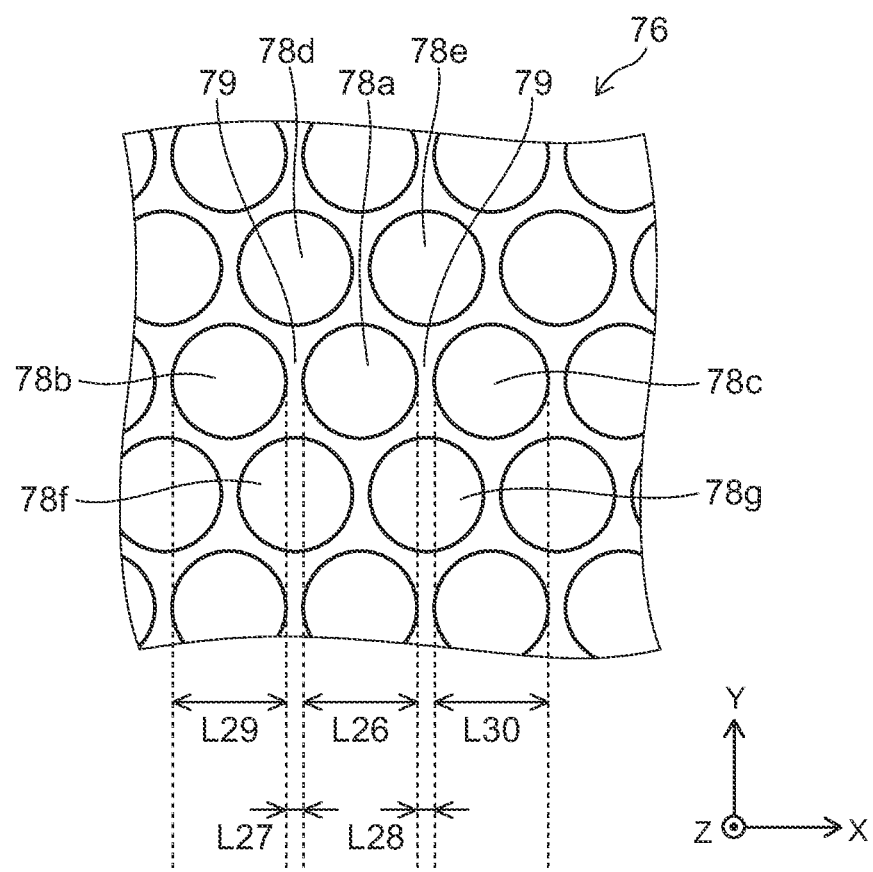
FIG. 17 is an enlarged view showing pores in one sparse portion.

FIG. 17 shows a part of the second porous part 70a viewed along the Z-direction, and is an enlarged view showing the pore 78 in the one sparse portion 76.

As shown in FIG. 17, the plurality of pores 78 include a first pore 78a located at the center portion of the sparse portion 76 and six pores 78 (second to seventh pores 78b to 78g) surrounding the first pore 78a. The second to seventh pores 78b to 78g are adjacent to the first pore 78a. The second to seventh pores 78b to 78g are pores 78 nearest to the first pore 78a of the plurality of pores 78. As described above, other than the first compact section 92 and the third compact section 74, the configuration of the second porous part 70a can be the same as the configuration of the first porous part 90. In this case, the first pore 78a can correspond to the first pore 96a, the second pore 78b can correspond to the second pore 96b, the third pore 78c can correspond to the third pore 96c, the fourth pore 78d can correspond to the fourth pore 96d, the fifth pore 78e can correspond to the fifth pore 96e, the sixth pore 78f can correspond to the sixth pore 96f, and the seventh pore 78g can correspond to the seventh pore 96g. Therefore, the detailed description is omitted.

Figure 18:
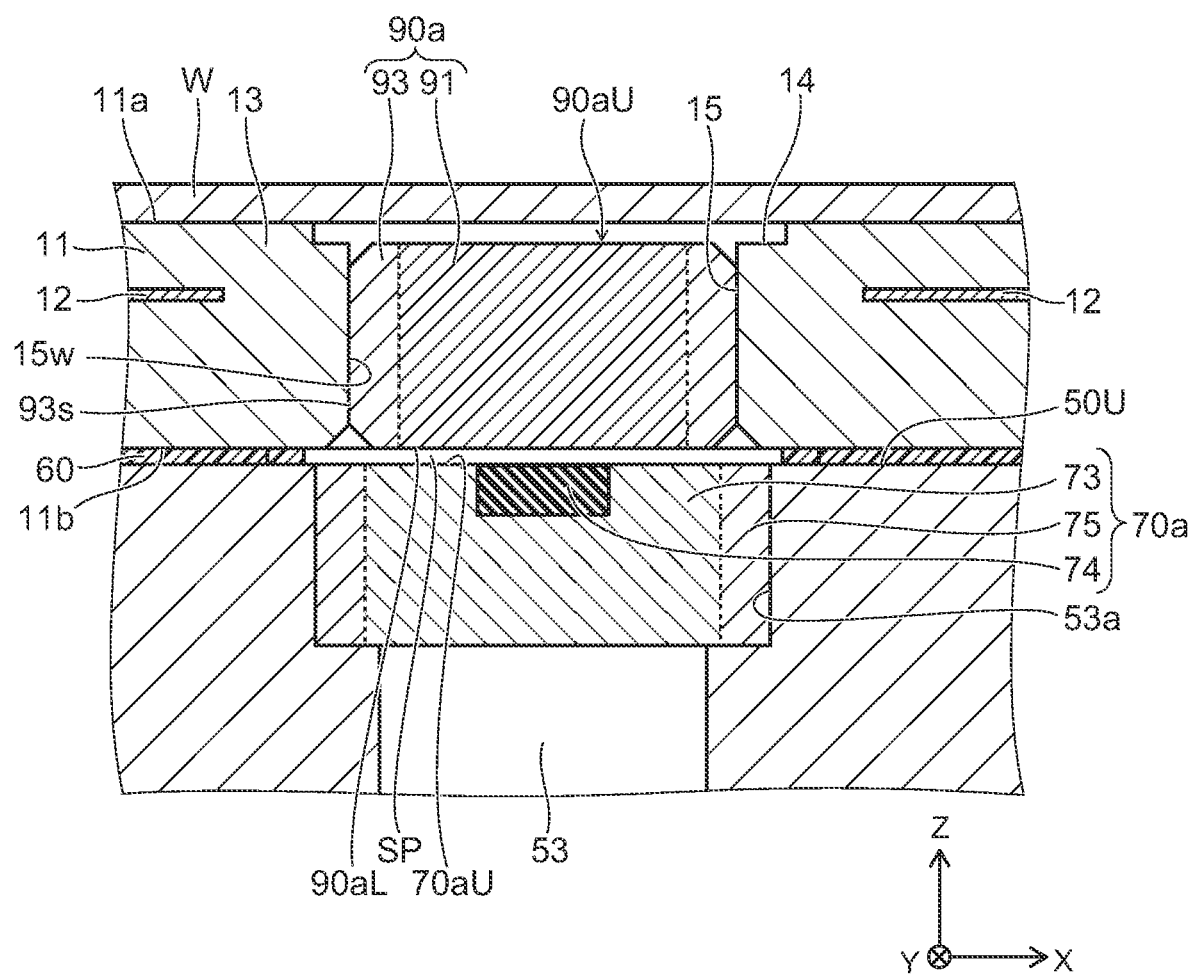
FIG. 18 is a schematic cross sectional view illustrating another electrostatic chuck according to the second embodiment.

FIG. 18 is a schematic cross sectional view illustrating another electrostatic chuck according to the second embodiment.

FIG. 18 illustrates the neighborhood of the second porous part 70a as well as FIG. 13A.

In this example, the hole part 15b (a link hole for linking the first porous part 90a and the groove 14) is not provided in the through hole 15 provided in the ceramic dielectric substrate 11. For instance, a diameter of the through hole 15 (a length along the X-direction) does not change in the Z-direction and is generally constant.

As shown in FIG. 18, at least a part of an upper surface 90aU of the first porous part 90a is exposed to the first major surface 11a side of the ceramic dielectric substrate 11. For instance, the position in the Z-direction of the upper surface 90aU of the first porous part 90a is the same as the position in the Z-direction of the bottom of the groove 14.

In this way, the first porous portion 90a may be disposed generally over the through hole 15. A link hole having a small diameter cannot be provided in the through hole 15. This can make the flow rate of the gas flowing in the through hole 15 large. The first porous part 90a having high insulating property can be disposed in the most part of the through hole 15. The high resistance to arc discharge can be obtained.

FIG. 19 is a schematic cross sectional view illustrating another electrostatic chuck according to the second embodiment.

FIG. 19 illustrates the neighborhood of the first porous part 90a as well as FIG. 13A.

In this example, the first porous part 90a is not integrated with the ceramic dielectric substrate 11.

A bonding member 61 (adhesive) is provided between the first porous part 90a and the ceramic dielectric substrate 11. The first porous part 90a is bonded to the ceramic dielectric substrate 11 with the bonding member 61. For instance, the bonding member 61 is provided between the side surface of the first porous part 90a (the side surface 93s of the second compact section 93) and the inner wall 15w of the through hole 15. The first porous part 90a and the ceramic dielectric substrate 11 do not need to be in contact with each other.

The bonding member 61 is e.g. a silicone adhesive. The bonding member 61 is e.g. an elastic member having elasticity. The elastic modulus of the bonding member 61 is e.g. lower than the elastic modulus of the second compact section 93 of the first porous part 90a, and lower than the elastic modulus of the ceramic dielectric substrate 11.

In the structure in which the first porous part 90a and the ceramic dielectric substrate 11 are bonded by the bonding member 61, the bonding member 61 can be used as a cushioning material against the difference between the thermal contraction of the first porous part 90a and the thermal contraction of the ceramic dielectric substrate 11.

The embodiments of the invention have been described above. However, the invention is not limited to the above description. For instance, the electrostatic chuck 110 has been illustrated with reference to the configuration based on the Coulomb force. However, the electrostatic chuck 110 is also applicable to the configuration based on the Johnsen-Rahbek force. Those skilled in the art can appropriately modify the above embodiments, and such modifications are also encompassed within the scope of the invention as long as they include the features of the invention. Furthermore, various components in the above embodiments can be combined with each other as long as technically feasible. Such combinations are also encompassed within the scope of the invention as long as they include the features of the invention.

What is claimed is:

1. An electrostatic chuck comprising:
a ceramic dielectric substrate having a first major surface for mounting a suction target and a second major surface on opposite side from the first major surface;
a base plate supporting the ceramic dielectric substrate and including a gas feed channel; and
a first porous part provided at a position between the base plate and the first major surface of the ceramic dielectric substrate, the position being opposed to the gas feed channel,
the ceramic dielectric substrate including a first hole part located between the first major surface and the first porous part,
the first porous part including:
a porous section including a plurality of pores; and
a first compact section being more compact than the porous section, and
the porous section including a plurality of sparse portions including a plurality of pores including a first pore and a second pore, and a dense portion having a higher density than the sparse portion,
each of the plurality of sparse portions extending in a first direction,
the dense portion is located between the plurality of sparse portions, and in the second direction, dimension of the plurality of pores provided in each of the plurality of sparse portions is smaller than dimension of the dense portion.

2. The electrostatic chuck according to claim 1, wherein aspect ratio of the plurality of pores provided in each of the plurality of sparse portions is 30 or more and 10000 or less.

3. The electrostatic chuck according to claim 1, wherein as viewed along the first direction, the first pore is located in a central part of the sparse portion, and among the plurality of pores, number of pores neighboring the first pore and surrounding the first pore is six.

* * * * *